(12) United States Patent
Okojie

(10) Patent No.: US 6,769,303 B1
(45) Date of Patent: Aug. 3, 2004

(54) MULTI-FUNCTIONAL MICRO ELECTROMECHANICAL SILICON CARBIDE ACCELEROMETER

(75) Inventor: Robert S. Okojie, Strongsville, OH (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 10/669,587

(22) Filed: Sep. 24, 2003

Related U.S. Application Data

(62) Division of application No. 10/124,689, filed on Apr. 12, 2002, now Pat. No. 6,706,549.

(51) Int. Cl.[7] .................. G01P 15/00; H01L 29/00; H01L 21/00
(52) U.S. Cl. ............. 73/514.16; 257/417; 257/E21.507
(58) Field of Search ............... 73/514.16, 514.29, 73/493; 257/414, 417, E21.507, E21.508

(56) References Cited

U.S. PATENT DOCUMENTS

| | | |
|---|---|---|
| 5,447,067 A | 9/1995 | Bieble |
| 5,559,358 A | 9/1996 | Burns |
| 5,576,250 A | 11/1996 | Diem |
| 5,637,905 A | 6/1997 | Carr |
| 5,952,572 A | 9/1999 | Yamashita |
| 6,145,380 A | 11/2000 | MacGugan |
| 6,248,646 B1 | 6/2001 | Okojie |

*Primary Examiner*—Helen Kwok
(74) *Attorney, Agent, or Firm*—Kent N. Stone

(57) ABSTRACT

A method of bulk manufacturing SiC sensors is disclosed and claimed. Materials other than SiC may be used as the substrate material. Sensors requiring that the SiC substrate be pierced are also disclosed and claimed. A process flow reversal is employed whereby the metallization is applied first before the recesses are etched into or through the wafer. Aluminum is deposited on the entire planar surface of the metallization. Photoresist is spun onto the substantially planar surface of the Aluminum which is subsequently masked (and developed and removed). Unwanted Aluminum is etched with aqueous TMAH and subsequently the metallization is dry etched. Photoresist is spun onto the still substantially planar surface of Aluminum and oxide and then masked (and developed and removed) leaving the unimidized photoresist behind. Next, ITO is applied over the still substantially planar surface of Aluminum, oxide and unimidized photoresist. Unimidized and exposed photoresist and ITO directly above it are removed with Acetone. Next, deep reactive ion etching attacks exposed oxide not protected by ITO. Finally, hot phosphoric acid removes the Al and ITO enabling wires to connect with the metallization. The back side of the SiC wafer may be also be etched.

6 Claims, 30 Drawing Sheets

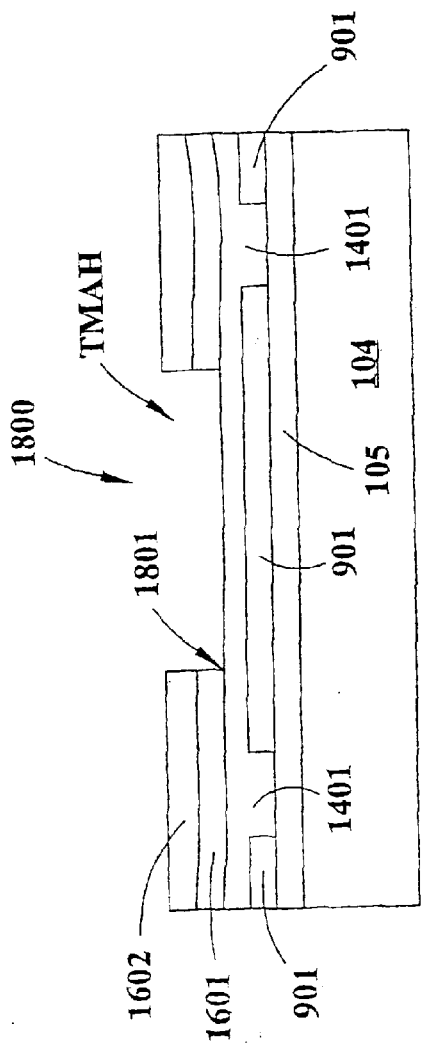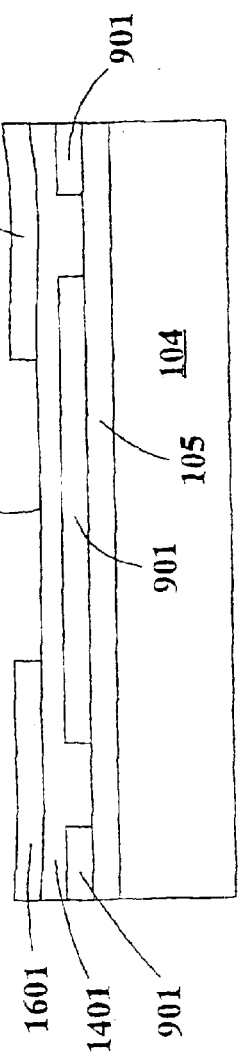
FIG. 18
FIG. 19

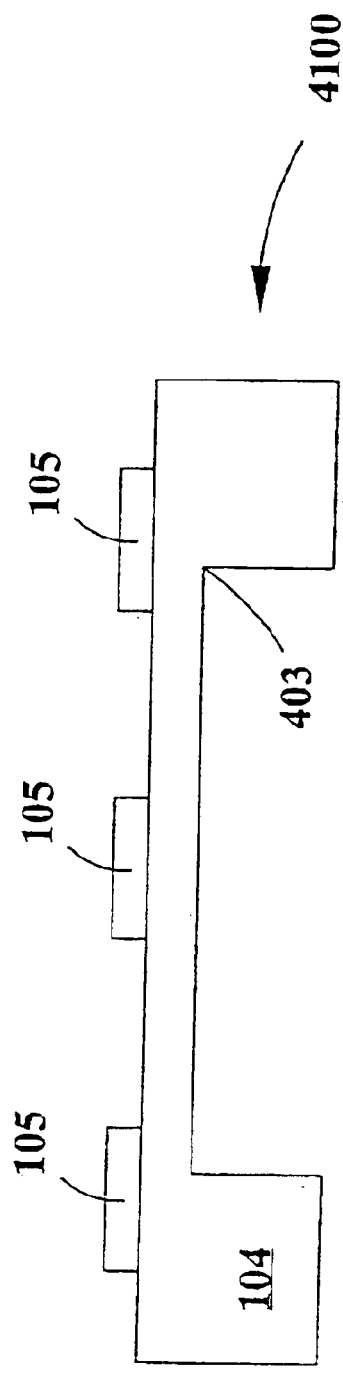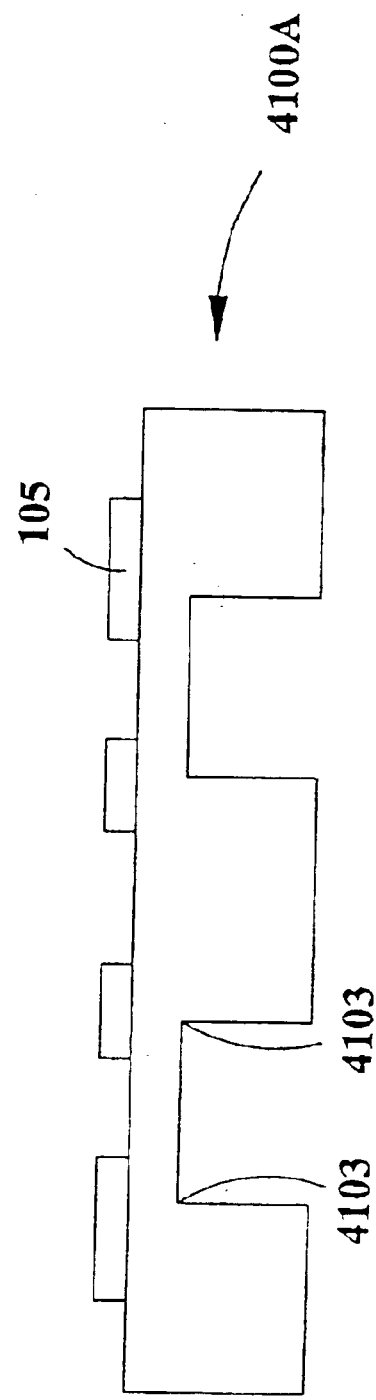

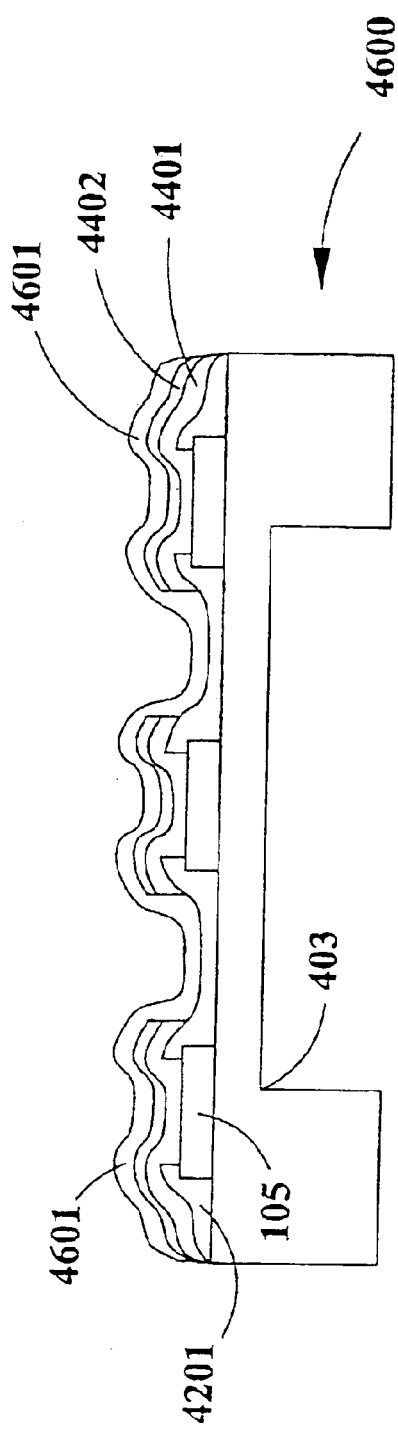
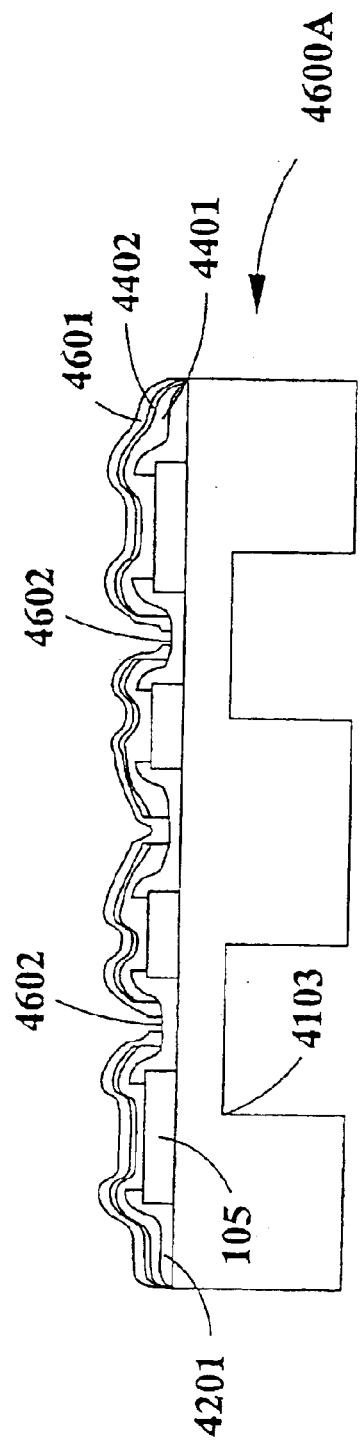

MULTI-FUNCTIONAL MICRO ELECTROMECHANICAL SILICON CARBIDE ACCELEROMETER

This is a divisional of application Ser. No. 10/124,689, which was filed on Apr. 12, 2002 now U.S. Pat. No. 6,706,549.

ORIGIN OF THE INVENTION

The invention described herein was made by an employee of the United States Government, and may be manufactured and used by the government for government purposes without the payment of any royalties therein and therefor.

FIELD OF THE INVENTION

This invention is in the field of micro electromechanical devices or related materials.

BACKGROUND OF THE INVENTION

Strain gages have been bonded on metal diaphragms to produce pressure sensors or accelerometers. Because these transducers are made of materials with dissimilar properties, they suffer from coefficient of thermal expansion (CTE) mismatch, which leads to fatigue and early failure. In addition the production process is time consuming since each strain gage must be placed on the diaphragm one at a time.

I am a named inventor of U.S. Pat. No. 5,637,905 to Carr et al. and it discloses a high temperature pressure and displacement microsensor made from a Si substrate. A first coil structure is positioned within a recess in the Si and a pressure diaphragm is glass bonded about the periphery to the rim of the semiconductor substrate. A second coil structure is positioned on the underside of the pressure diaphragm and is electrically isolated from the first coil structure. The coils are inductively coupled together and provide an output indicative of changes in the coupling between the coils.

My U.S. Pat. No. 6,248,646 discloses a process for making an array of SiC wafers on standard larger industry sized wafers. This patent discusses the operating conditions for SiC and SiC-On-Insulator technology and cites the need for sensors made from SiC.

U.S. Pat. No. 5,447,067 to Biebl et al. discloses an acceleration sensor constructed on Silicon-On-Insulator substrate. Piezoresistors are disclosed for use in conjunction with a proof mass suspended by one or more resilient elements. These sensors are not useable in harsh environments. U.S. Pat. No. 5,576,250 to Diem et al. discloses a process for the production of accelerometers using Silicon-On-Insulator technology. The '250 patent discloses an accelerometer with moving elements consisting of one or more flexible beams supporting a seismic mass. Further, the '250 patent discloses packaging of accelerometers and the driving circuit by multichip module technology.

Sensors manufactured from 3C-SiC, 4H-SiC and 6H-SiC are used in harsh environments, for example high temperature environments, high vibration environments, radiation environments and corrosive environments. "H" means hexagonal and "C" as used in "3C" means Cubic and both refer to the crystalline structure of SiC.

SiC is a wide band gap semiconductor. Semiconductors are materials whose electrical conductivity is between that of a conductor and that of an insulator. "If an electron in an atom happens to be in an energy level which overlaps a higher, empty level, that electron proves to be essentially free from its original atom. It is then capable of moving freely through the solid, and the material will be a conductor, i.e., a metal. However, if the electron in the highest energy state of the atom exists in a level which does not overlap higher energy levels, this electron will be firmly held to its atom. Such a material will be a nonconductor of electricity. An intermediate case exists if the energy levels do not overlap but are close enough so that the energy gap between them is of the order of thermal energies. These materials are called semiconductors." *Introduction To Physics For Scientists And Engineers*, Copyright 1969, McGraw-Hill, Inc., Library of Congress Catalog Card Number 69-13598, ISBN 07-008833-0, pgs. 804–805.

The semiconductor SiC is known as a wide band gap semiconductor meaning that electrons in the valence band must traverse an energy gap of several electron Volts (eV) at 300K to reach the conduction band. SiC is operable at temperatures up to 873 K without substantial leakage current. Leakage current, for example that is due to the is temperature of the operating environment, is kept to a minimum in SiC.

Batch fabrication of a single function type SiC sensors, namely, pressure sensors, has been demonstrated and has piqued the interest of many who desire stable sensors operable in harsh environments. SiC is, however, a very expensive material with wafer costs much greater than conventional silicon semiconductor for a two inch diameter wafer. One such wafer can produce between 100–400 pressure sensors.

There is not enough demand, however, for batch production of pressure sensors alone. Unlike silicon based sensors, silicon carbide sensors have a low volume specialized market. The current process for fabricating silicon carbide sensors is limited to producing only one type of sensor per wafer at a time and, as such, the commercial viability of silicon carbide is greatly reduced. Further, there is no known process for simultaneously making different devices (sensors) having different functionality at the same time. Several different types of sensors exist such as accelerometers having proof masses suspended therein and pressure sensors having diaphragms.

There is a need for SiC accelerometers having suspended proof masses. Presently, such devices are not manufactured and are not believed to exist. Further, there is a need for the batch fabrication of multifunctional, multistructural sensors and other devices manufactured from SiC.

Although batch fabrication of SiC pressure sensors has been demonstrated, the economic viability of SiC sensors heretofore has been in doubt because there is no need for the mass production of one type of sensor, i.e, a pressure sensor. Industry remains reluctant to devote its resources to commercial production of SiC sensors for the following reasons:

(1) unlike Si sensors, SiC sensors of any one particular type have a low volume, specialized market;

(2) SiC has an inherently high material and capital cost when only one sensor is made in bulk from a single wafer and as a result the profitability incentive does not exist to encourage commercial production; and, (3) the current process for fabricating these devices is limited to producing only one type of device at a time therefore doubling the fabrication cost for making two different devices.

One major problem in the batch manufacturing of SiC multistructural sensors is that some of the sensors such as accelerometers require the construction of apertures or annular recesses in the substrate. An aperture or a recess is three dimensional. Sensors such as accelerometers desirably include a suspended mass in the substrate from which they are manufactured. This mass is made from SiC and the piezoresistance of the n-type or p-type SiC which connects the mass to the remainder of the substrate is measured. Mathematical analysis of the piezoresistance determines the value and direction of acceleration. The suspension of the mass requires that the substrate be etched very precisely.

It is not possible to precisely construct the apertures or annular recesses in the SiC substrate before metallization because they interfere adversely with the remaining fabrication/manufacture of the SiC sensor. SiC sensors precisely measure the piezoresistance of specific areas of n-type SiC and, therefore, it is necessary that the contact metallization be precisely located and engage the n-type SiC in those specific areas. Positioning of the contact metallization is controlled by a masking process where photoresist is spun onto the wafer that is held under suction on a chuck. Therefore, if the wafer was perforated prior to application of the photoresist it would not be possible to create a suction due to the perforations. Further, the suction from the chuck through the perforations in the wafer would disturb the uniform application of the photoresist. SiC wafers are rotated between 1000 to 7000 revolutions per minute as photoresist is applied to the center of the wafer. As photoresist is spread radially it will impact whatever three dimensional apertures or recesses exist and will not spread evenly in those areas thereby resulting in low yield of the wafer. By low yield, it is meant that many sensors will be defective due to poor patterning of the photoresist. At costs approaching $3,500 for a two inch diameter SiC wafer with epilayer, it is important that its use be maximized. It is desired that approximately 100–400 sensors be generated from each wafer so as to maximize the economy of volume and batch production of the sensors.

A better understanding of the invention will be had when reference is made to the SUMMARY OF THE INVENTION, BRIEF DESCRIPTION OF THE DRAWINGS, DESCRIPTION OF THE INVENTION and CLAIMS which follow hereinbelow.

SUMMARY OF THE INVENTION

The simultaneous fabrication of multi-functional SiC micro electromechanical devices is disclosed, claimed and described herein. Simultaneous fabrication of flow sensors, pressure sensors, accelerometers, inertial sensors, angular rate sensors and yaw rate sensors from SiC is accomplished by this invention. These sensors may be configured as desired by the particular user for the user's specific application. The instant invention allows for the simultaneous production of SiC sensors of different types from the same wafer thus greatly increasing the viability of SiC for use as sensors.

Substrates comprising other materials are specifically contemplated by this invention. AlN, BC, BN, and $Al_2O_3$ may, for example be used. Any substrate upon which an epilayer may be grown is contemplated to be within the scope of this invention.

This invention offers a global platform for bulk micro machining process in SiC or in any one of several other material mentioned above. It offers various manufacturers the opportunity to simultaneously produce multifunctional products on a single SiC wafer (or wafer made from another material) and thereby greatly lower capital equipment and production cost The sensing principle utilizes the piezoresistance of the single crystal SiC or other material. Piezoresistance indicates a dependence of resistivity on mechanical strain. In particular, the instant invention by way of example utilizes the piezoresistance of the n- or p-type epilayer of a SiC wafer. The low resistivity n-type epilayer, in effect, acts as a variable resistor which is mounted atop a high resistivity p-type SiC substrate. It is the mechanical deformation of this n-type epilayer which causes resistivity changes which are measured by applying a voltage differential across a portion of the n- (or, p-) type epilayer. As the resistance changes as a function of mechanical deformation of the n-type epilayer, the flow of electrical current through the n-type epilayer will change for a given voltage. The instant invention discloses a novel SiC sensor as well as a method for bulk manufacturing of multifunction SiC sensors. The examples given for the bulk manufacturing of SiC sensors are equally applicable to sensors made from the other materials mentioned above.

One major factor in bulk micromachined SiC sensors is the presence of three dimensional structures. It is difficult to apply a planar coating of photoresist if three dimensional apertures or recesses exist in the substrate. To overcome this barrier, this invention employs a process flow reversal whereby contact metal is first sputter deposited onto the n-type epilayer of the SiC wafer before recesses or apertures are etched into or through the wafer. Additionally, if and once holes are pierced through the wafer it is extremely difficult to hold the wafer in a vacuum chuck. Aluminum is deposited by electron beam evaporation (e-beam evaporation) onto the entire planar surface of the contact metal. Photoresist is spun on the substantially planar contact metal and then masked and exposed under ultraviolet light. Photoresist imidized under such exposure is stripped away with developer and then the unwanted Aluminum is etched with TMAH (Trimethyl Ammonium Hydroxide). Next, the metal(s) (in this case layers of Platinum, Tantalum Disilicide and Titanium) is/are dry etched using the Aluminum as the etch mask.

Next, photoresist is spun onto the remaining Aluminum and the oxide layer on the n-type epilayer. Another mask is applied, exposed under ultraviolet light and the imidized photoresist is stripped away after developing and the unimidized photoresist is left behind. Next, Indium Tin Oxide (ITO or Nickel (Ni)) is sputter deposited on the Aluminum and the unimidized photoresist. The ITO, however, does not completely cover the unimidized photoresist enabling Acetone to dissolve the unimidized photoresist when submersed in Acetone. This process lifts off ITO (or Nickel) on the photoresist. Now with the oxide exposed and the remainder of the wafer protected by the ITO (or Nickel), deep reactive ion etching occurs and recesses or apertures may be formed in the SiC substrate. This process may be used to produce a suspended proof mass in the SiC wafer. The proof mass may move out of the plane in which it resides at rest. Recesses in any shape or form may be created in the SiC wafer using these techniques. The ITO and the remaining Aluminum is removed with hot phosphoric acid. Wires can then be attached to the contact metal such as Platinum. Other metals may be used for the contact. Depending on the configuration of the sensor desired, the back side of the SiC wafer may be etched to provide a diaphragm.

Accordingly, it is an object of the present invention to provide an accelerometer made from SiC, for example, or from any-material used as a substrate upon which an epilayer may be grown or deposited It is a further object of the present invention to provide a method of producing an accelerometer made from SiC. Further, it is a further object of the present invention to provide a method of simultaneously making a plurality of mulifunctional sensors from SiC, for example, or from any material used as a substrate upon which an epilayer may be grown or deposited. It is a further object of the present invention to manufacture a plurality of similar or diverse sensors simultaneously by a process which includes the step of first applying contact metal to engage the SiC and to sense resistance changes of the SiC in response to mechanical deformation of the SiC. It is a further object of the present invention to provide SiC sensors capable of operating in harsh environments.

These and other objects will be best understood when reference is made to the BRIEF DESCRIPTION OF THE DRAWINGS, DESCRIPTION OF THE INVENTION, AND CLAIMS which follow hereinbelow.

BRIEF DESCRIPTION OF THE DRAWINGS

FIGS. 9–13 illustrate preparation of the n-type epilayer for metallization wherein:

FIG. 9 is a schematic illustration of the application of growing or depositing oxide (or Silicon Nitride or other dielectric) followed by application of photoresist to the n-type epilayer of SiC which is then followed by the application of masked ultraviolet light.

FIG. 10 is a schematic illustration similar to FIG. 9 with the imidized photoresist being first removed by developer and not shown.

FIG. 11 is a schematic illustration similar to FIG. 10 with the oxide being etched by buffered hydrofluoric acid (BHF).

FIG. 12 is a schematic illustration similar to FIG. 11 after etching of oxide.

FIG. 13 is a schematic illustration similar to FIG. 12 after submersion in Acetone which removed the unimidized photoresist.

FIG. 15 is an enlargement of a portion of FIG. 15 illustrating the material of the ohmic contact.

FIG. 18 is a schematic illustration similar to FIG. 17 which shows the result of aqueous TMAH etching of the Al which was not protected by the photoresist.

FIG. 19 is a schematic illustration similar to FIG. 18 which shows the removal of the unimidized photoresist by use of Acetone.

FIG. 25 further illustrates selective deep reactive ion etching.

FIG. 34 illustrates the oxide exposed to the deep reactive ion etching.

FIGS. 37–42A illustrate schematically the preparation of the n-type epilayer for metallization wherein:

FIG. 37 illustrates the application of photoresist, a desired mask and ultraviolet light to a portion of a wafer.

FIG. 38 illustrates the application of Indium Tin Oxide or Nickel to the portion of the wafer as illustrated in FIG. 37.

FIG. 39 illustrates etching of the n-type epilayer to form the resistors.

FIG. 40 illustrates the removal of the ITO/Nickel illustrated in FIG. 39 which remained on the n-type piezoresistors.

FIG. 41 is identical to FIG. 40 except a recess has been manufactured in the back side of the substrate.

FIG. 41A is similar to FIG. 41 except a different recess has been manufacture in the back side of the substrate and a different pattern or piezoresistors has been formed out of the n-type epilayer.

FIGS. 42 and 42A are similar to FIGS. 41 and 41A respectively except an additional layer of oxide has been grown or deposited over the n-type piezoresistors and the substrate.

FIG. 46 is similar to FIG. 45 except ITO has been applied to the wafer portion. Before application of the ITO, photoresist was applied in preparation for liftoff of ITO (or Nickel). The wafer portion of FIG. 46 undergoes the same process as the wafer portion of FIG. 46A.

FIG. 46A is similar to FIG. 44A except photoresist is applied to the wafer, soft baked, masked and exposed to ultraviolet light as illustrated in FIGS. 21 and 22. Imidized photoresist is stripped away and ITO is applied to the wafer. Acetone dissolves the unimidized photoresist and the ITO cap lifts off as illustrated in FIGS. 23 and 33.

FIG. 47 is not affected by the DRIE because of the ITO (or Nickel) coat.

A better understanding of the invention will be had when reference is made to the following DESCRIPTION OF THE INVENTION and CLAIMS.

DESCRIPTION OF THE INVENTION

Figures 1, 2:
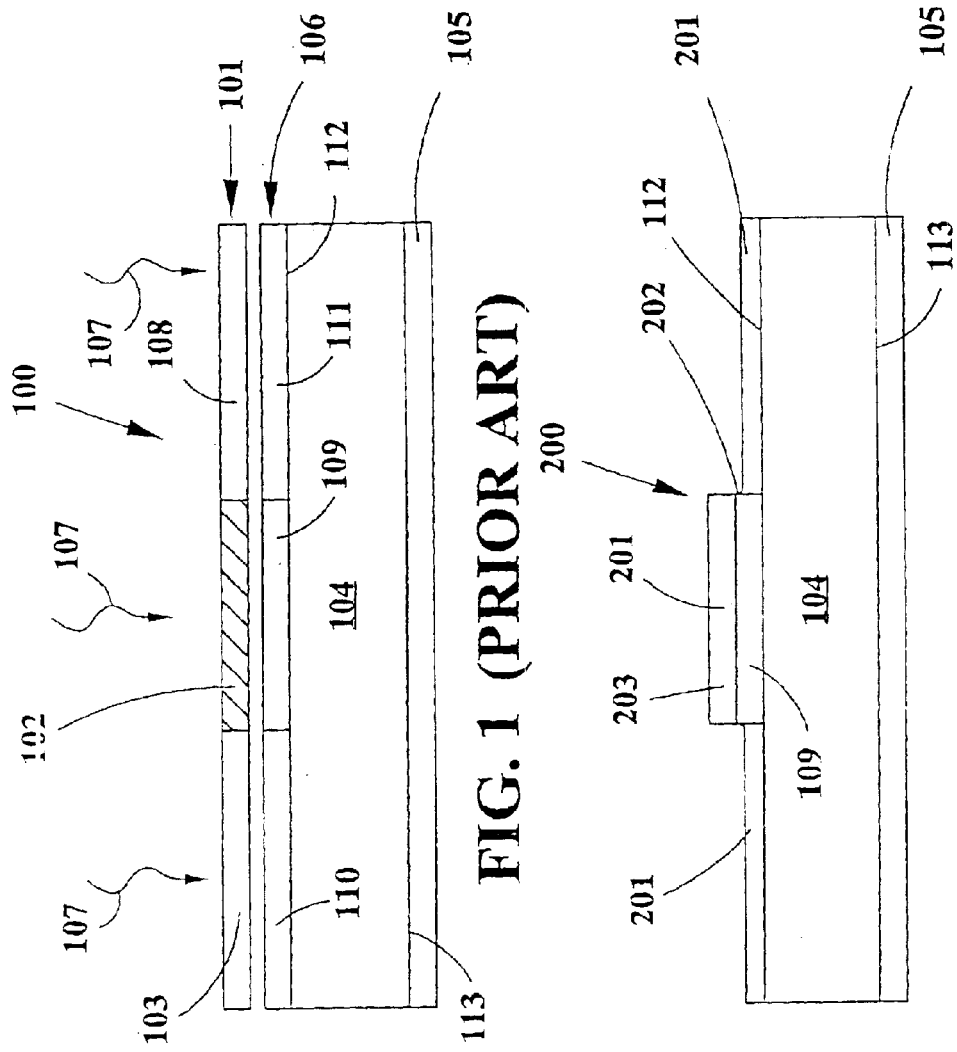
FIG. 1 is a prior art schematic illustration of ultraviolet light applied to a mask which is positioned in proximity to the back side of a portion (p-type) of a 3C-SiC, 4H-SiC or 6H-SiC wafer having an n-type epilayer on the front side thereof
FIG. 2 is a prior art schematic illustration of the portion of the wafer illustrated in FIG. 1 with the imidized photoresist removed and with a layer of Indium Tin Oxide, or Nickel, deposited on the p-type portion of the back side of the wafer.
Figure 8:
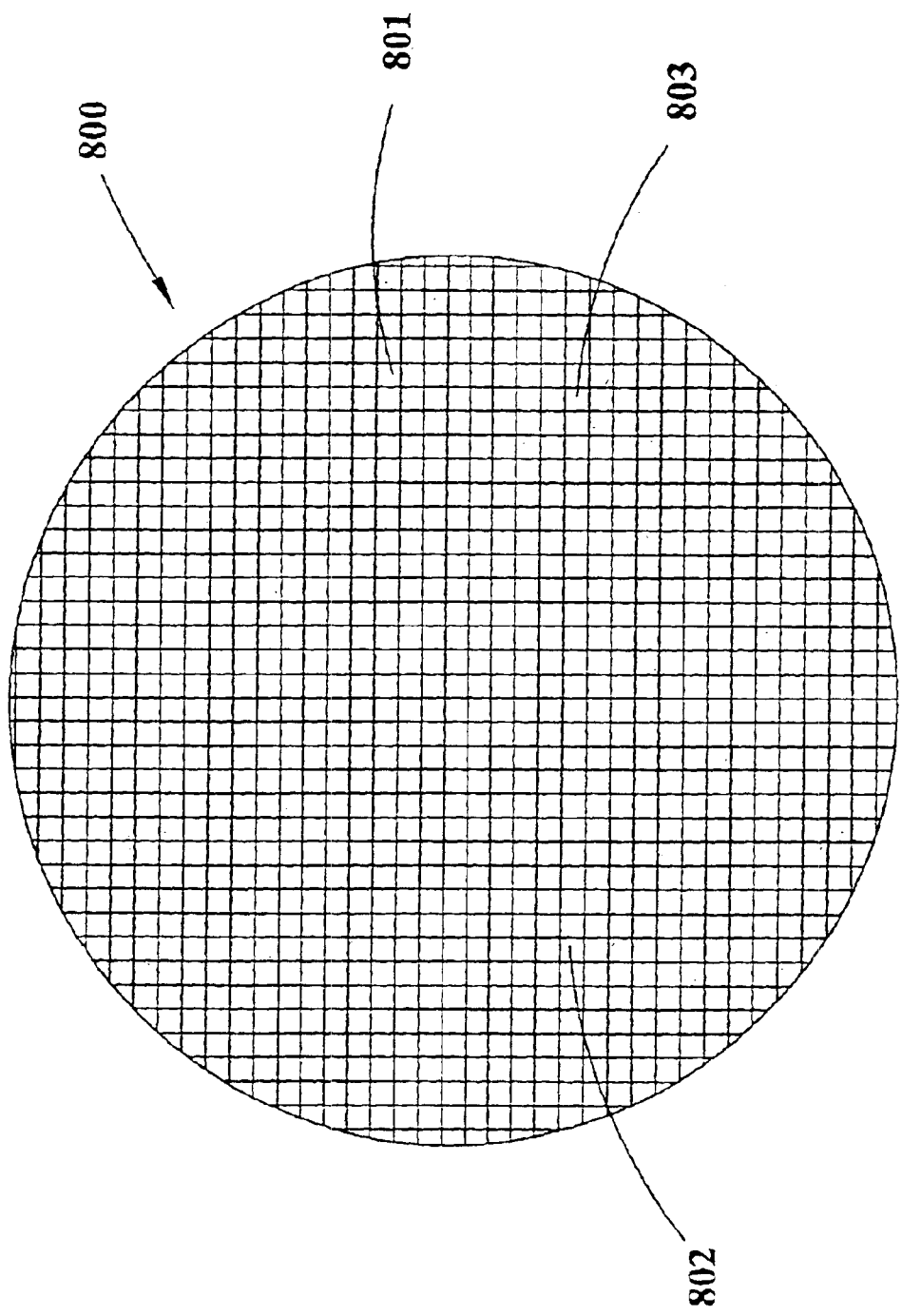
FIG. 8 is a macroscopic view of an entire one inch SiC wafer schematically illustrating a grid system where sensors will be manufactured.

FIG. 1 is a prior art schematic illustration of a portion 100 of a wafer 800 with ultraviolet light 107 applied to a mask 101 which is positioned in proximity to photoresist 106 applied to the back side 112 of a 3C-SiC, 4H-SiC or 6H-SiC wafer 800. The front side 113 of the portion 100 of a wafer 800 has an n-type epilayer 105 on the front side 113 thereof. Reference numeral 113 indicates the p-n junction between the n-type SiC epilayer and the p-type SiC substrate. FIG. 8 is an enlarged view of an entire SiC wafer 800 schematically illustrating a grid system of approximately 500 areas where approximately 500 sensors, for example, can be manufactured.

Mask 101 can contact photoresist 106 or it can be in proximity to the photoresist 106. Mask 101 includes transparent portions 103 and 108 as well as a circular opaque portion 102. The SiC substrate 104 and the n-type SiC epilayer 105 may be any of the 3C-SiC, 4H-SiC or 6H-SiC polytypes. Ultraviolet light imidizes portions 110 and 111 of the photoresist 106. Opaque portion 102 of mask 101 blocks, or masks, ultraviolet light from reaching the photoresist beneath it and therefore that portion of the photoresist 106 is referred to as unimidized 109 photoresist. Imidized portions 110, 111 of the photoresist 106 are stripped away with a chemical developer. Photoresists are photosensitive materials which after photoimaging and subsequent processing, resist action of certain chemicals in desired areas.

FIG. 2 is a prior art schematic illustration 200 of the portion 100 of the wafer 800 illustrated in FIG. 1 with the imidized photoresist 110, 111 removed and with a layer of Indium Tin Oxide 201, deposited on the p-type SiC 104 portion of the back side 112 of the wafer 800. The Indium Tin Oxide (ITO) 201 does not completely cover the unimidized photoresist 109 leaving an exposed portion 202 of unimidized photoresist. Acetone is used to dissolve the unimidized photoresist 109 and liftoff portion(cap) 203 of the ITO 201 atop the unimidized photoresist 109.

Figure 3:
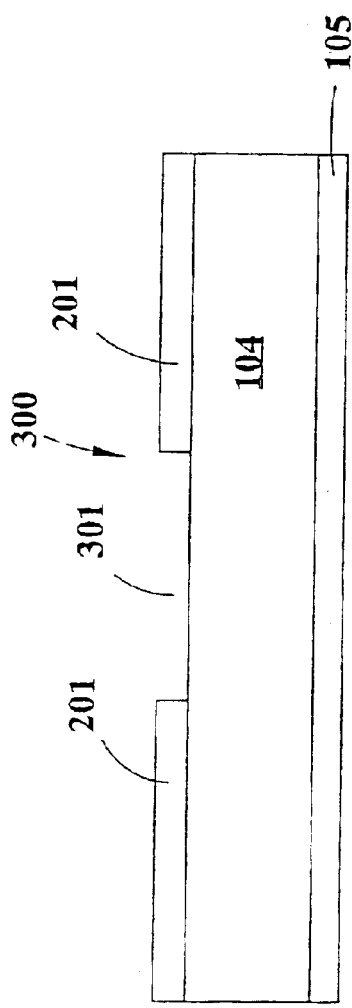
FIG. 3 is a prior art schematic illustration of the photoresist illustrated in FIG. 2 removed by immersing the wafer in Acetone, so as to lift off the ITO (or Nickel) cap.

FIG. 3 is a prior art schematic illustration 300 of the photoresist 109 illustrated in FIG. 2 removed by bathing the wafer in Acetone, so as to lift off the ITO cap 203. Reference numeral 301 generally indicates the area in which the unimidized photoresist 109 was removed.

Figure 4:
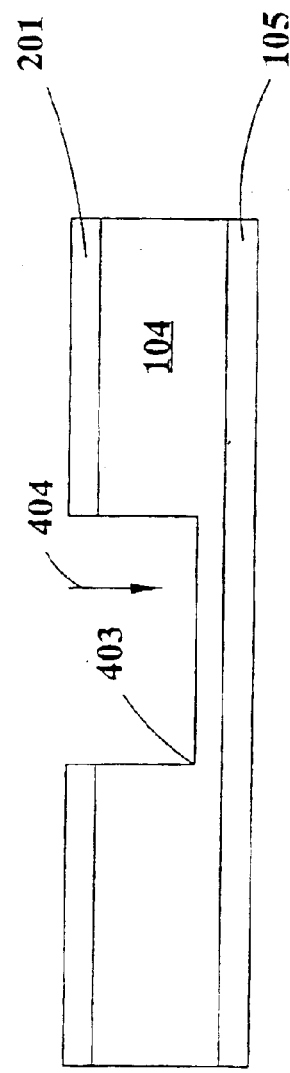
FIG. 4 is a prior art schematic illustration of deep reactive ion etching using Sulfur HexaFluoride ($SF_6$) to physically and chemically etch the back side of the portion of the SiC wafer forming a cavity in such a diaphragm.

FIG. 4 is a prior art schematic illustration 400 of deep reactive ion etching using Sulfur HexaFluorine ($SF_6$) to etch the back side 112 of the portion of the SiC wafer 800 forming a cavity 403. The shape of etched cavity 403 can be shaped as dictated by the specifications for a particular SiC sensor.

Figure 5:
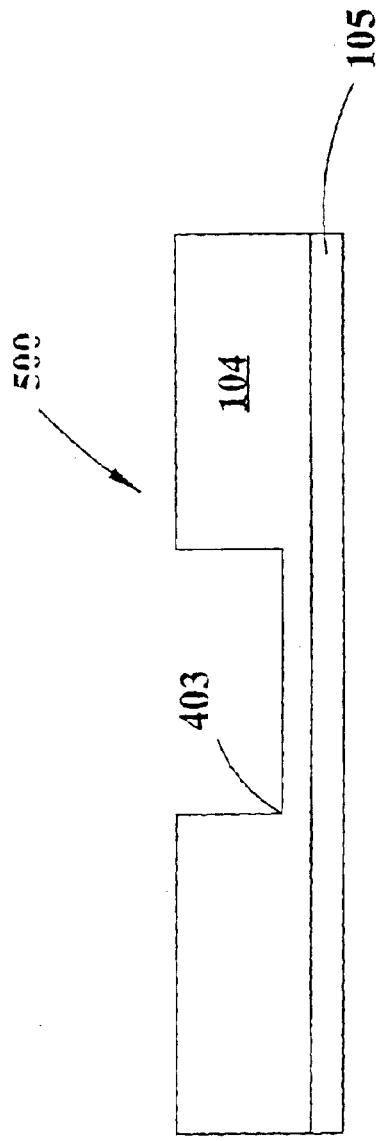
FIG. 5 is a prior art schematic illustrating the removal of the ITO from the SiC in a Hydrochloric Acid (HCl) solution.
Figure 6:
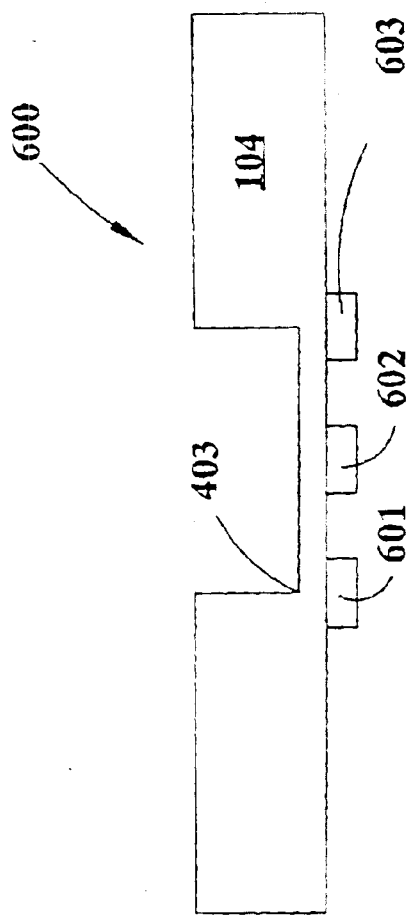
FIG. 6 is a prior art schematic illustration of a pressure sensor formed in the SiC which has a cavity and n-type SiC piezoresistive sensors.
Figure 6A:
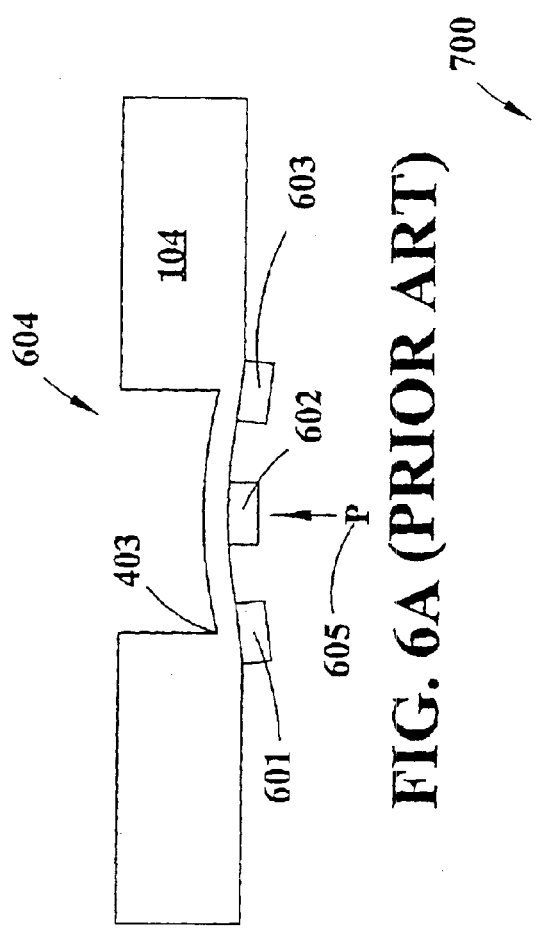
FIG. 6A is a prior art schematic illustration of the pressure sensor illustrated in FIG. 6 shown with pressure applied thereto.
Figure 7:
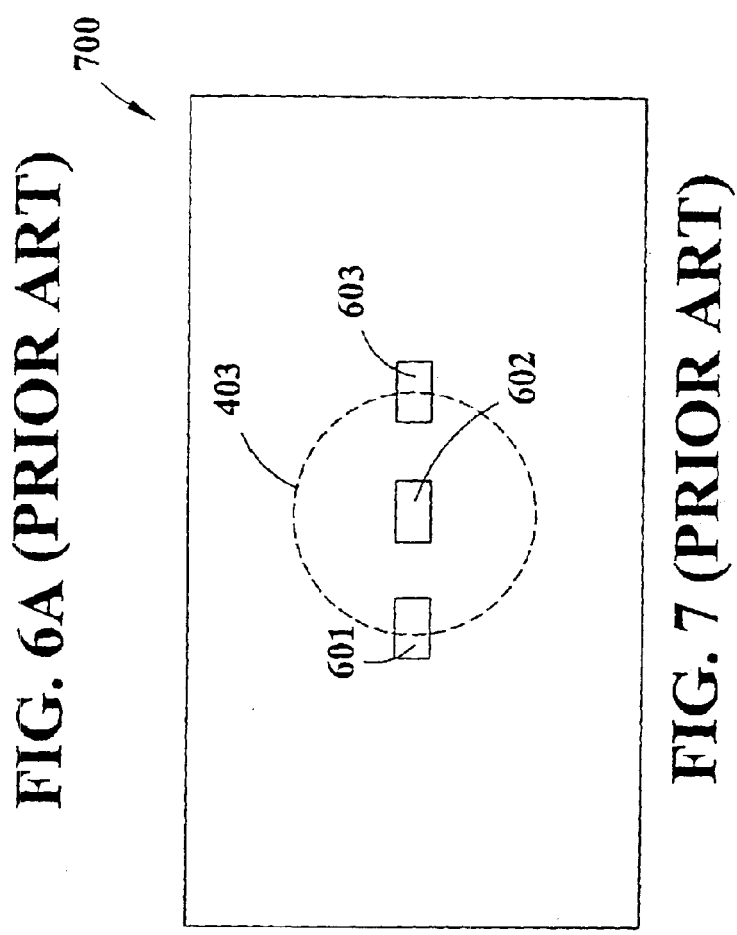
FIG. 7 is a front side view of the pressure sensor of FIGS. 6 and 6A.

FIG. 5 is a prior art schematic illustration 500 without the ITO 201. ITO is removed from the SiC by submersing the wafer 800 in a Hydrochloric Acid (HCl) bath. FIG. 6 is a prior art schematic illustration 600 of a pressure sensor formed in the SiC which has a cavity 403 and n-type SiC piezoresistors 601, 602 and 603. FIG. 6A is a prior art schematic illustration 604 of the pressure sensor illustrated in FIG. 6 shown with pressure illustrated by arrow 605 applied thereto. FIG. 7 is a front side view 700 of the pressure sensor of FIGS. 6 and 6A illustrating the piezoresistors 601, 602 and 603 as well as the cavity 403 in phantom.

FIG. 8 is an enlarged view of an entire SiC wafer 800 schematically illustrating a grid system of approximately 500 areas where approximately, for example, 500 sensors can be manufactured. A different number of sensors or devices may be manufactured. Reference numeral 801 illustrates a grid or space where an accelerometer, for instance, may be made. Reference numeral 802 illustrates a grid or space where a pressure sensor, for example, may be made. And, reference numeral 803 illustrates a grid or space where another accelerometer may be made. Devices having architecture of all types may be made anywhere on the wafer using the processes disclosed herein. The processes disclosed herein enable the manufacture of SiC devices having three dimensional recesses.

Figure 9:
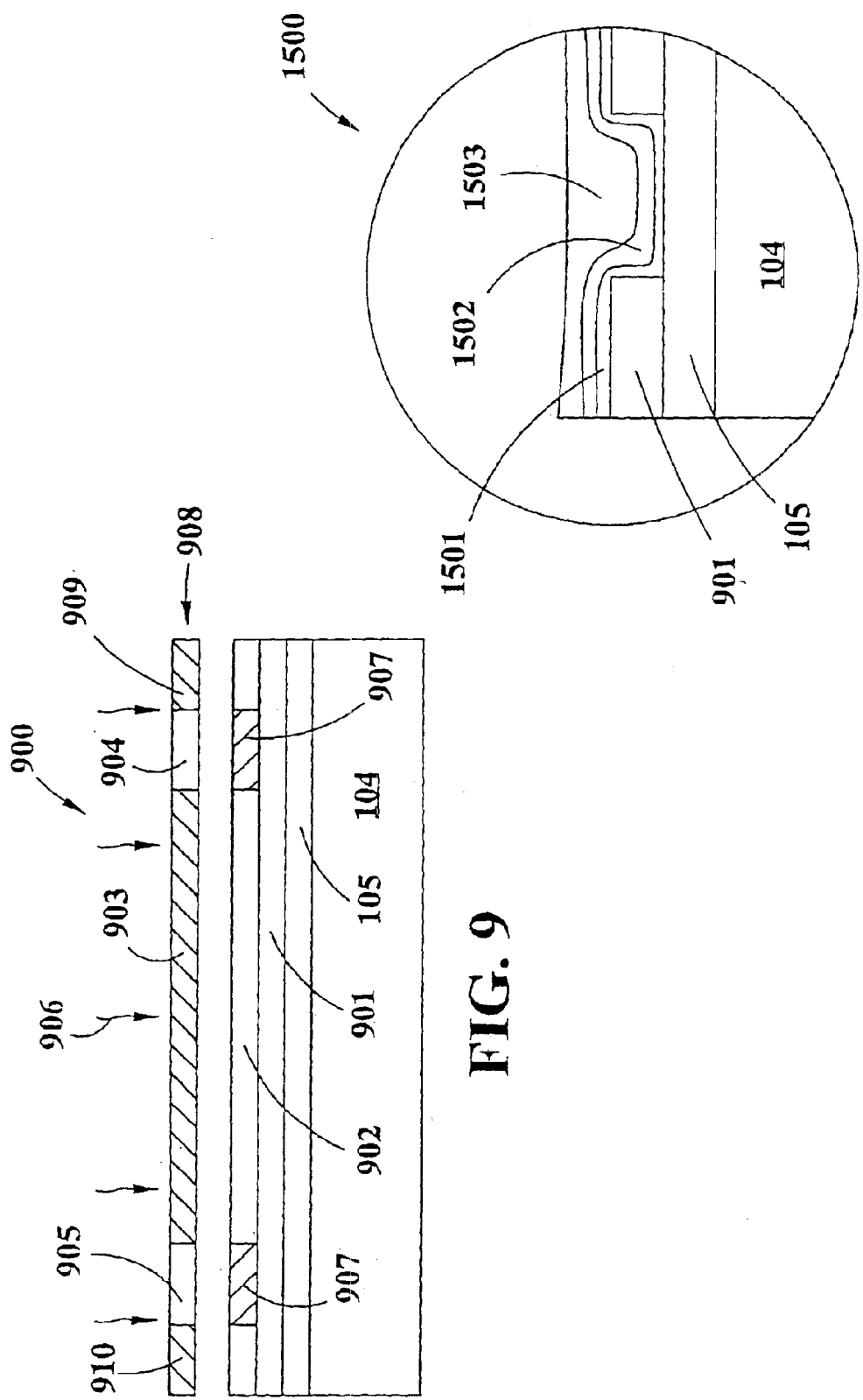

FIGS. 9–13 illustrate one method of preparation of the n-type epilayer for metallization. FIGS. 37–42 illustrate an example of a more specific method of preparation of the n-type epilayer for metallization. FIG. 9 is a schematic illustration 900 of the application of oxide 901 on the n-type SiC epilayer followed by application of photoresist 902 onto the oxide which is then followed by the application of mask 908 and ultraviolet light 906. Mask 908 is illustrated spaced apart from the layer of phortoresist 902. Alternately, the mask 908 could engage the photoresist 902. Mask 908 is illustrated having opaque portions 903, 909 and 910 and transparent portions 904 and 905. Ultraviolet light 906 imidizes portions 907 of the photoresist.

Those skilled in the art will readily recognize that the illustrations in all of the drawing Figures are not to scale. Typically, the p-type SiC wafer is on the order of 400 microns thick, however, other widely varying thicknesses may be used without departing from the spirit and scope of the invention as claimed herein below. The wafer is held down on the chuck by suction. Photoresist is applied to the center of the wafer while it is being rotated at a speed of 1000 to 7000 revolutions per minute and applied to thicknesses on the order of 6 microns. Other thicknesses of photoresist may be used. The n-type SiC epilayer is approximately 2 microns thick, however, the n-type epilayer can have thicknesses ranging from 0.5–5 microns thick. Contact metallization is preferably sputter deposited to a thickness of 300 to 600 nm for the three layer metal of Titanium, Tantalum Disilicide and Platinum. However, other thicknesses of the contact metal and other metals may be used.

The thickness of the oxide applied to the SiC (both the p-type and the n-type epilayer) is in the range of 50 to 100 nm. Other thickness of the oxide are contemplated. The protective Aluminum is applied by an electron beam evaporation (EBE) to a thickness of 1 to 2 microns but, again, other thickness or other deposition methods are contemplated. The protective Indium Tin Oxide or Nickel is sputter deposited to a thickness in the range of 2 to 10 microns with other thicknesses specifically contemplated within the scope of the claims.

Figure 10:
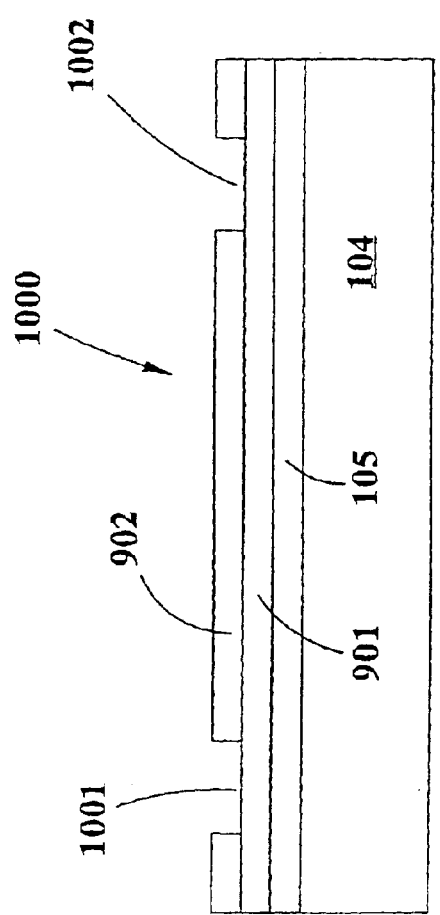

FIG. 10 is a schematic illustration 1000 similar to FIG. 9 with the imidized photoresist 907 having been removed by developer and not shown. Reference numerals 1001 and 1002 illustrate areas where the imidized photoresist was removed.

Figure 11:
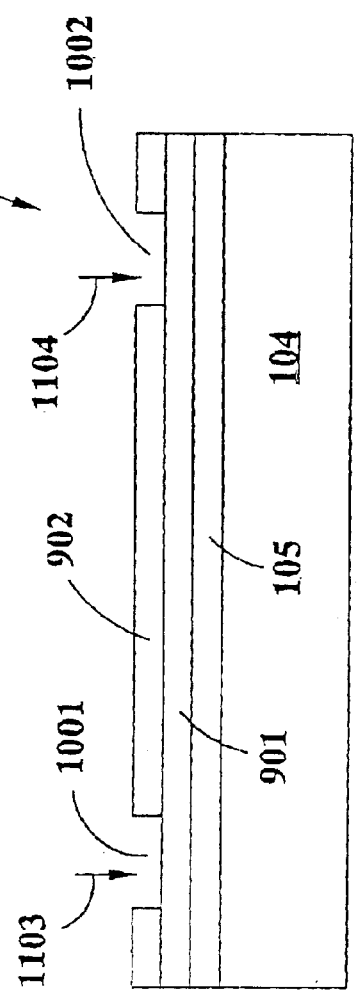
Figure 12:
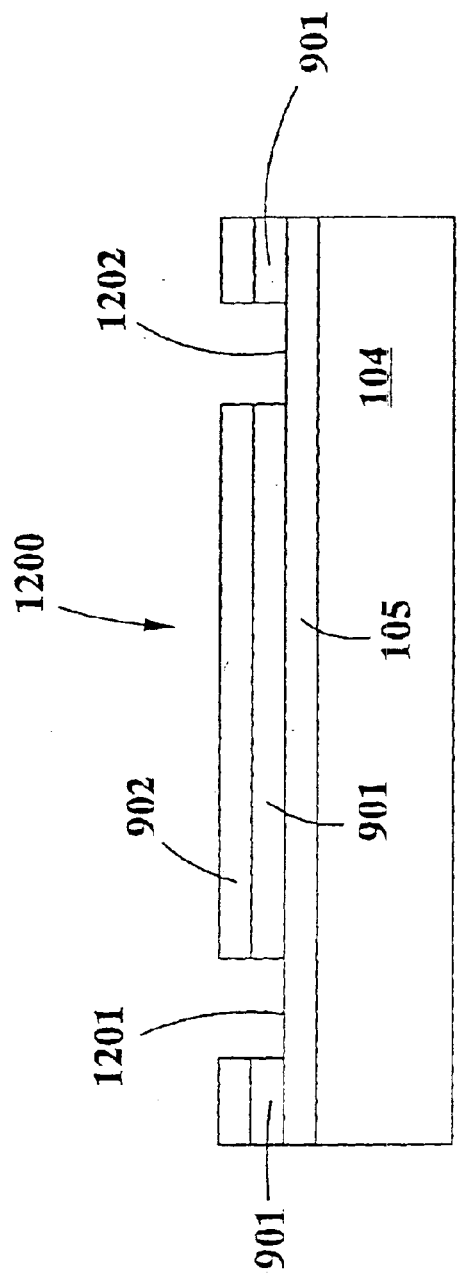

FIG. 11 is a schematic illustration 1100 similar to FIG. 10 with the oxide 901 being etched with buffered hydrofluoric acid (BHF). Arrow 1103 indicates wet etching of the oxide. Unimidized photoresist 902 protects the remainder of the oxide which is not etched. BHF etching continues until such time as the oxide is completely etched away. FIG. 12 is a schematic illustration 1200 similar to FIG. 11 after etching of oxide 901. Reference numerals 1201 and 1202 indicate the results of the BHF etching illustrated in FIG. 11.

Figure 13:
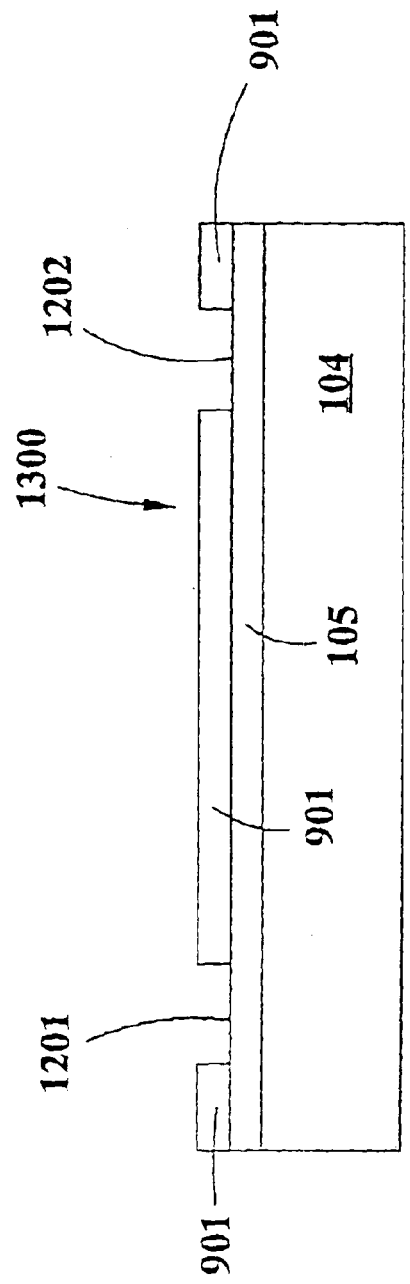

FIG. 13 is a schematic illustration 1300 similar to FIG. 12 after submersion of the wafer in Acetone which removed the unimidized photoresist 902 illustrated in FIG. 12.

Figure 14:
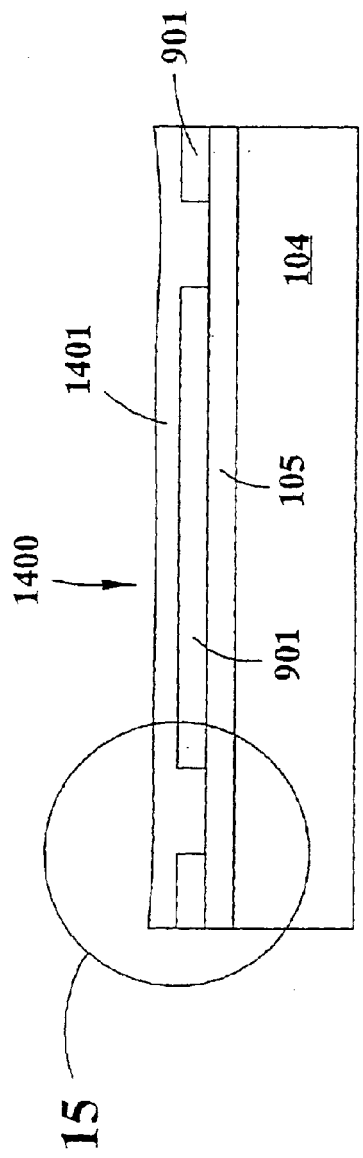
FIG. 14 is a schematic illustration of a portion of a SiC wafer with a Platinum/Tantalum Disilicide/Titanium (Pt/$TaSi_2$/Ti) trimetal applied thereto.

FIG. 14 is a schematic illustration 1400 of a portion of a SiC wafer with layers Titanium 1501(shown in FIG. 15), Tantalum Disilicide 1502 (shown in FIG. 15) and Platinum 1503 (shown in FIG. 15) (Ti/TaSi$_2$/Pt) (referred to herein as trimetal 1401 contact) applied to the oxide and to the n-type SiC epilayer. FIG. 14 represents the step of applying the contact metallization prior to the formation of any three dimensional recesses (including apertures) in the SiC wafer. Applying the contact metallization first enables photoresist to be spun on a substantially planar surface at thicknesses of approximately 6 microns. Further, application of the contact metallization first allows the Aluminum to be effectively applied at a thickness of 300 to 600 nm and allows the ITO to be effectively applied at a thickness of 2 to 10 microns. If the photoresist is spun onto a wafer having recesses or three dimensional apertures, then it will not be spread evenly with voids and beads occurring in the vicinity of the apertures resulting in low yield. The instant invention greatly increases the yield by etching the apertures after metallization occurs.

FIG. 15 is an enlargement of a portion of FIG. 14 illustrating the trimetal 1401. Wires are eventually connected to the trimetal pads when the sensors are complete. Metals other than the trimetal may be used. The Titanium layer is preferably 100 nm thick, Tantalum Disilicide is 400 nm thick and the top Platinum layer is 200 nm thick.

Figure 16:
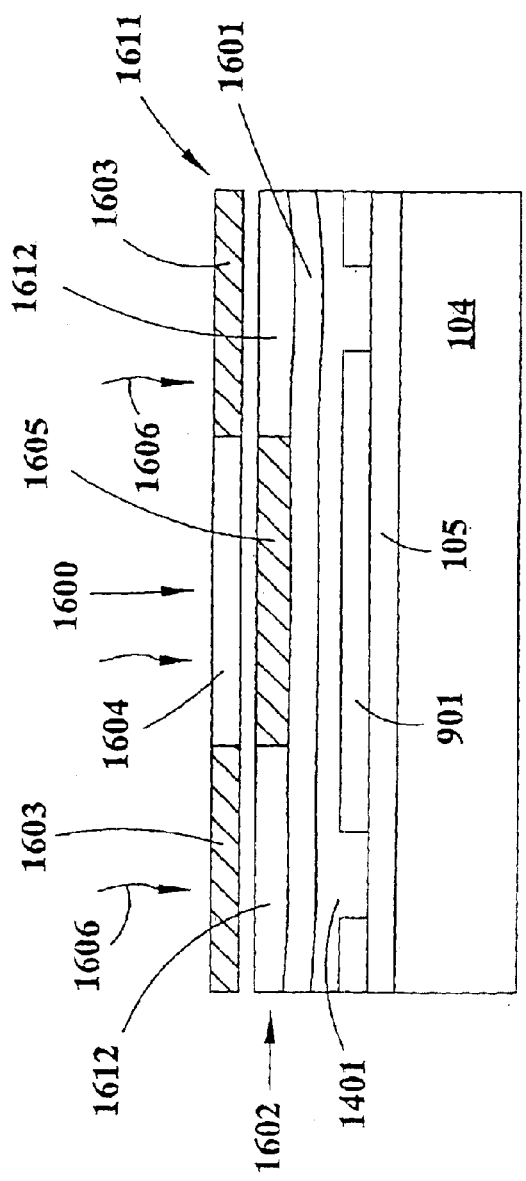
FIG. 16 is a schematic illustration of the SiC wafer portion of FIG. 14 with Aluminum (Al) applied onto the trimetal and photoresist applied onto the Aluminum (Al). A mask is also illustrated.

FIG. 16 is a schematic illustration 1600 of the SiC wafer portion of FIG. 14 with Aluminum (Al) 1601 applied onto the trimetal 1401 and photoresist 1602 spun onto the Aluminum (Al) 1601. Mask 1611 is also illustrated and contains opaque portions 1603 and a transparent portion 1604. The mask 1602 can be spaced apart or it can be in contact with the photoresist. Ultraviolet light imidizes portion 1605 of the photoresist 1602. Unimidized portions 1612 of photoresist 1602 do not receive ultraviolet light. The steps illustrated in FIG. 16 and in FIG. 16A lead to the definition of areas in the wafer portions which will have recesses or three dimensional structures.

Figure 16A:
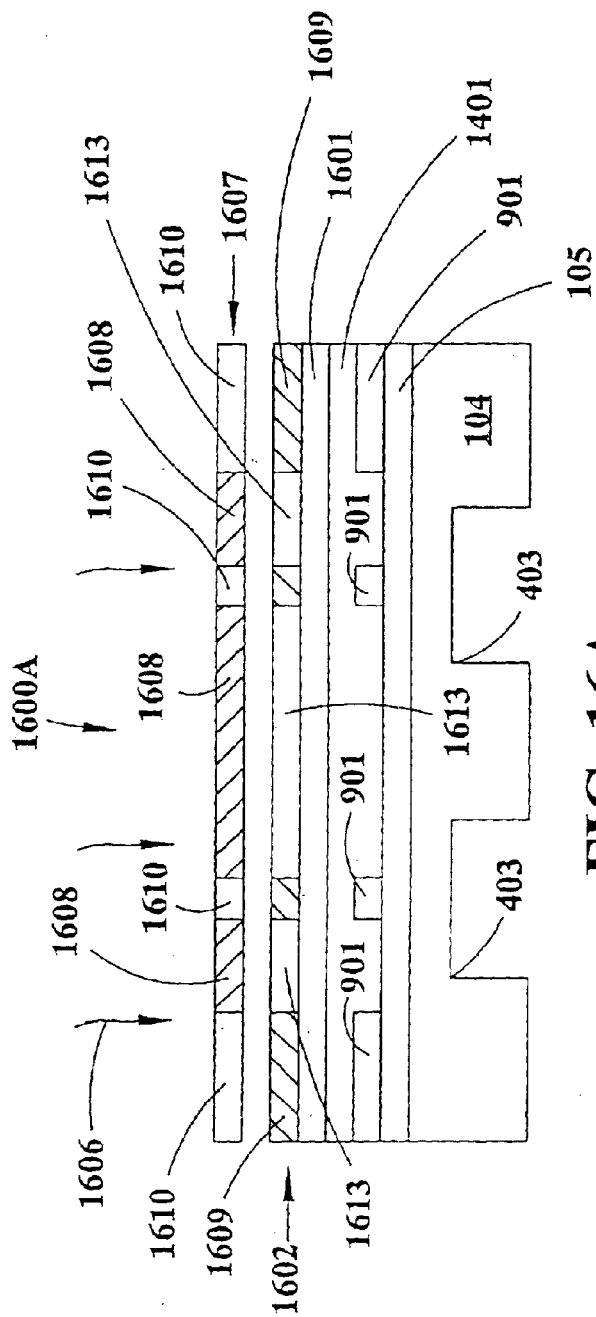
FIG. 16A is a schematic illustration of another SiC wafer portion with the trimetal, Al, photoresist and mask. The SiC wafer portion of FIG. 16A illustrates by way of example one possible configuration for an accelerometer.

FIG. 16A is a schematic illustration 1600A of another SiC wafer portion with the trimetal 1401, Al 1601, photoresist 1602 and mask 1607 applied thereto. The SiC wafer portion of FIG. 16A illustrates, by way of example, one possible configuration for an accelerometer. Mask 1607 includes opaque portions 1608 and clear portions 1610. The mask may be in contact with the photoresist or it may be spaced apart as shown in FIG. 16A. Ultraviolet light imidizes portions of the photoresist 1602. The imidized portions 1609 of the photoresist in FIG. 16A are stripped away by developer. FIGS. 27–36 represent steps which follow the processing of the wafer portion 1600A illustrated in FIG. 16A.

FIGS. 17–26 represent the processing of the wafer portion 1600 illustrated in FIG. 16. Those skilled in the art will readily recognize from reading this disclosure that the steps illustrated and taught in FIGS. 9–16, inclusive may be used to create virtually any pattern of metallic contact which engages the n-type epilayer. Further, those skilled in the art will readily recognize that the steps illustrated and taught in FIGS. 9–16, inclusive, in combination with the steps illustrated and taught in FIGS. 17–26 (described herein) and FIGS. 27–36 (described herein), may be used to create any desired pattern of metallic contact which engages the n-type SiC epilayer in combination with any desired three dimensional structure. FIGS. 17–26 schematically illustrate the creation of an aperture which extends through the SiC wafer. Further, FIGS. 27–36 schematically illustrate the creation of a suspended mass in a SiC wafer for use as an accelerometer. Application of the metallization to the n-type SiC at desired areas before etching into and/or through the front the n-type SiC epilayer 105 and/or the p-type substrate 104 enables the bulk manufacture of multistructural, multifunctional devices out of a single SiC wafer 800. The areas which are unnumbered in FIG. 8 will each contain a device which may be a sensor. Those devices on the wafer 800 may all be the same or they may be a mixture of many different devices. This gives industry the ability to commercialize SiC as the semiconductor of choice because at any given point in time there may not be a need for just one type of device whether it be a sensor or some other type of device.

Figure 17:
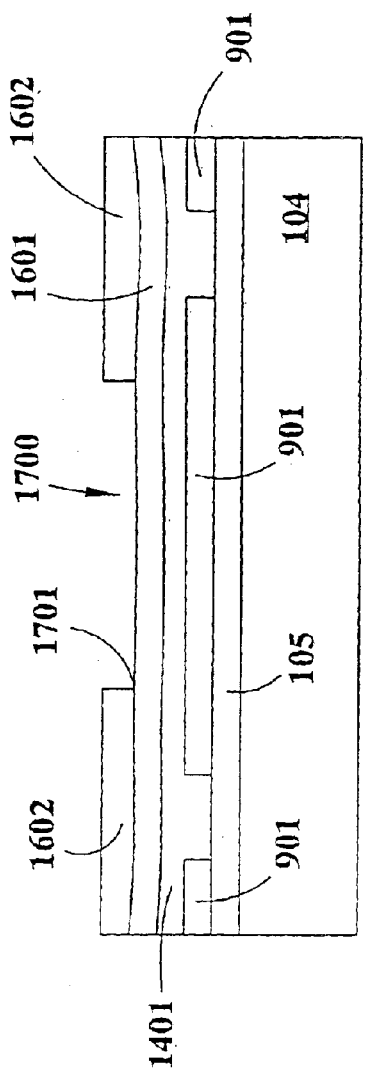
FIG. 17 is a schematic illustration similar to FIG. 16 except that the imidized photo resist has been stripped away by the developer.

FIG. 17 is a schematic illustration 1700 similar to FIG. 16 except that the imidized photoresist 1605 illustrated in FIG. 16 has been stripped away by the developer. Next, FIG. 18 is a schematic illustration 1800 similar to FIG. 17 which shows the result of aqueous TMAH etching of the Al 1601 which was not protected by the photoresist 1602. Reference numeral 1801 illustrates a sharp corner located at the junction of the Al 1601 and the trimetal 1401 which is achieved by the anisotropic etching of the Al 1601. The anisotropic etching is performed by immersing the entire wafer 800 in TMAH.

FIG. 19 is a schematic illustration 1900 similar to FIG. 18 which shows the wafer portion 1900 after the removal of the unimidized photoresist 1602. Acetone is used to remove the unimidized photoresist Reference numeral 1901 indicates the surface of the exposed trimetal 1401.

Figure 20:
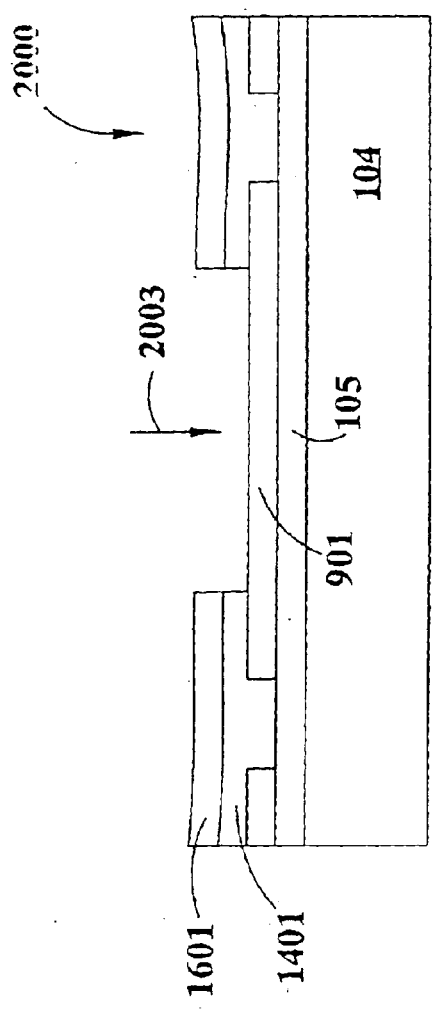
FIG. 20 is a schematic illustration similar to FIG. 19 illustrating Argon plasma etching of the trimetal ohmic material with the Al as the etch mask.

FIG. 20 is a schematic illustration similar to FIG. 19 illustrating Argon plasma etching 2003 of the trimetal 1401 ohmic material. Other inert gasses may be used to etch the trimetal which is approximately 300 to 600 nm thick. Reference numeral 2003 indicates the direction of the argon plasma etching.

Figure 21:
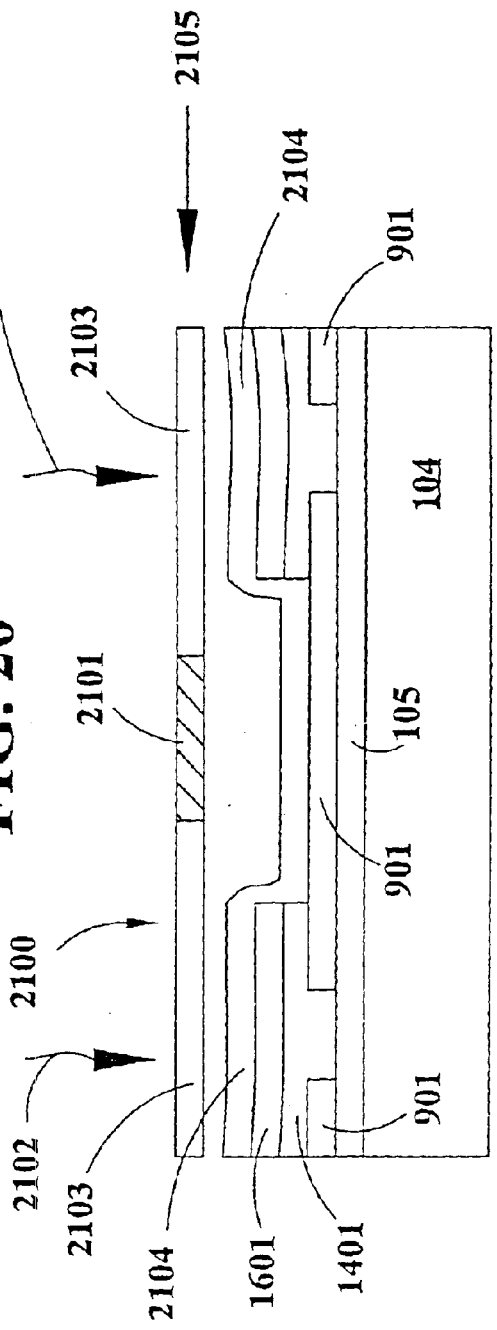
FIG. 21 is a schematic illustration similar to FIG. 20 illustrating the application of photoresist and a mask.
Figure 22:
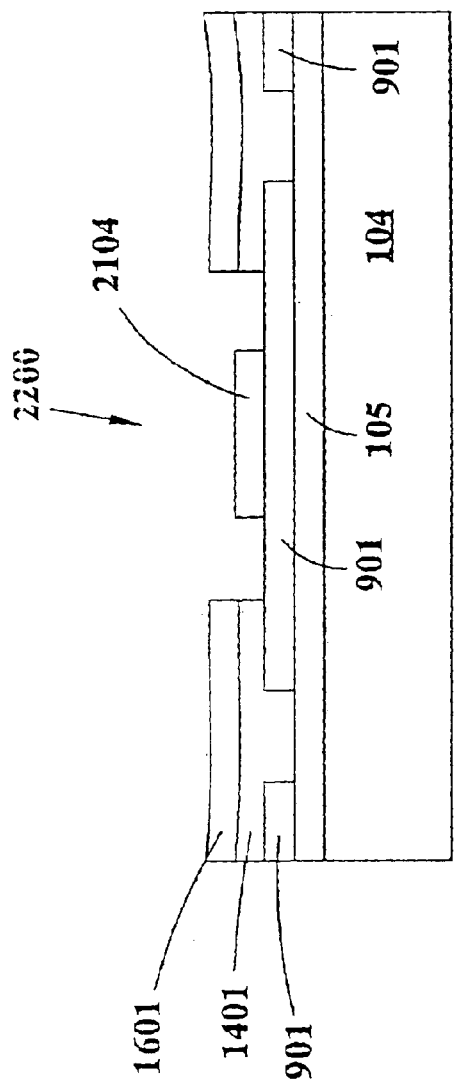
FIG. 22 is a schematic illustration similar to FIG. 21 with the UV-exposed photoresist developed and stripped away.

FIG. 21 is a schematic illustration 2100 similar to FIG. 20 illustrating the application of photoresist 2104 and a mask 2105 to the wafer portion. A portion of the trimetal has been removed and that portion now is covered with photoresist 2104. Photoresist 2104 is spun onto the wafer which is at this point in the process substantially planar. The trimetal is only 300 to 600 nm thick, the Al is 1–2 microns thick, and the photoresist is approximately 6 microns thick. FIG. 21 is a schematic illustration which presents an exaggerated three dimensional appearance of the trimetal 1401, Al 1601 and photoresist 2104. Mask 2105 includes an opaque portion 2101 and clear portions 2103. Mask 2105 is spaced apart for illustration but in reality it may touch the photoresist in places. Ultraviolet light 2102 is applied to the mask imidizing a portion of the photoresist 2104 under the transparent portions 2103 of the mask. The imidized photoresist is then stripped away with developer with the unimidized photoresist 2104 remaining as illustrated in FIG. 22. FIG. 22 is a schematic illustration 2200 similar to FIG. 21 with the imidized photoresist developed and stripped away.

Figure 23:
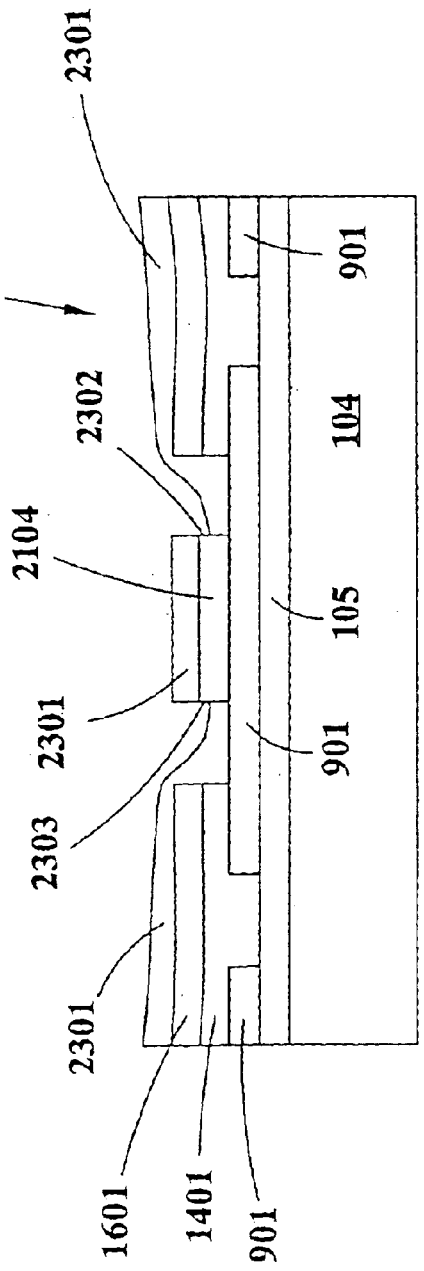
FIG. 23 is a schematic illustration similar to FIG. 22 with a layer of Indium Tin Oxide, (ITO), deposited on the Al, oxide and undeveloped photoresist.

FIG. 23 is a schematic illustration 2300 similar to FIG. 22 with a layer of Indium Tin Oxide, (ITO) 2301, deposited on the Al 1601, oxide 901 and which partially covers undeveloped photoresist 2104. Since the unimidized photoresist 2104 is approximately 6 microns thick and the ITO (or Nickel) is only 1–2 microns thick, a portion of the vertical rise 2302 and 2303 of the unimidized photoresist 2104 will be exposed and not covered by the ITO. In effect, an ITO (or Nickel) cap 2301 is formed on top of the unimidized photoresist (2104). The ITO cap 2301 is stripped away when the wafer is immersed in Acetone because the Acetone dissolves the unimidized photoresist 2104.

Figure 24:
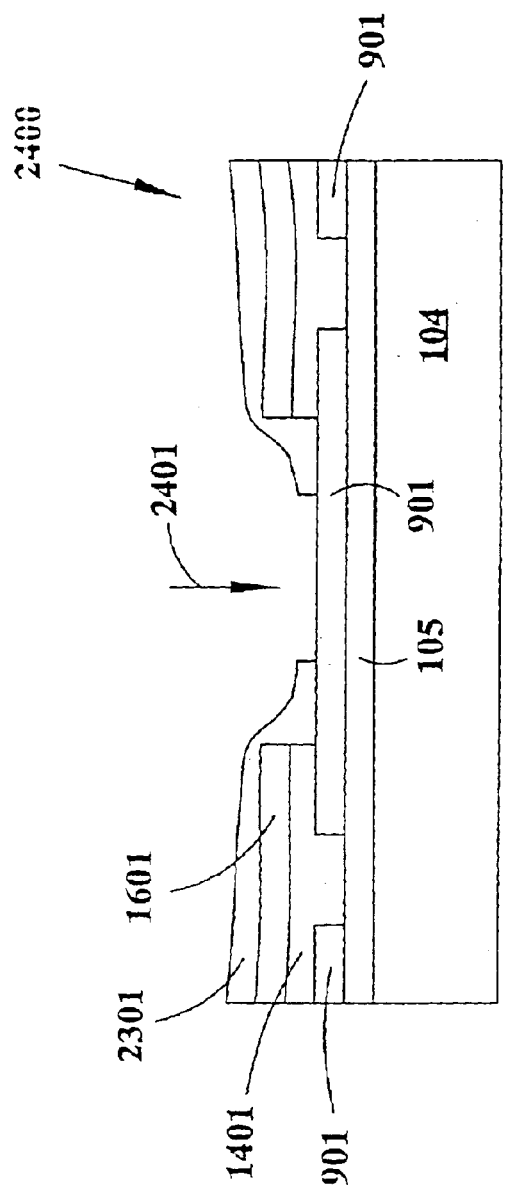
FIG. 24 is a schematic illustration similar to FIG. 23 with the Indium Tin Oxide cap above the unexposed photoresist and the unexposed photoresist removed.
Figure 25:
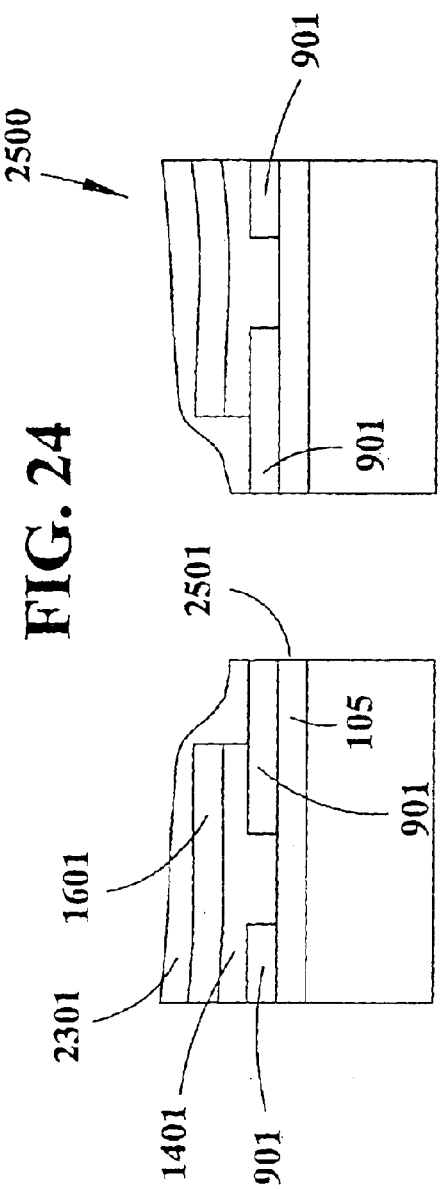
FIG. 25 is a schematic illustration similar to FIG. 24 illustrating a bore through the SiC wafer portion.
Figure 26:
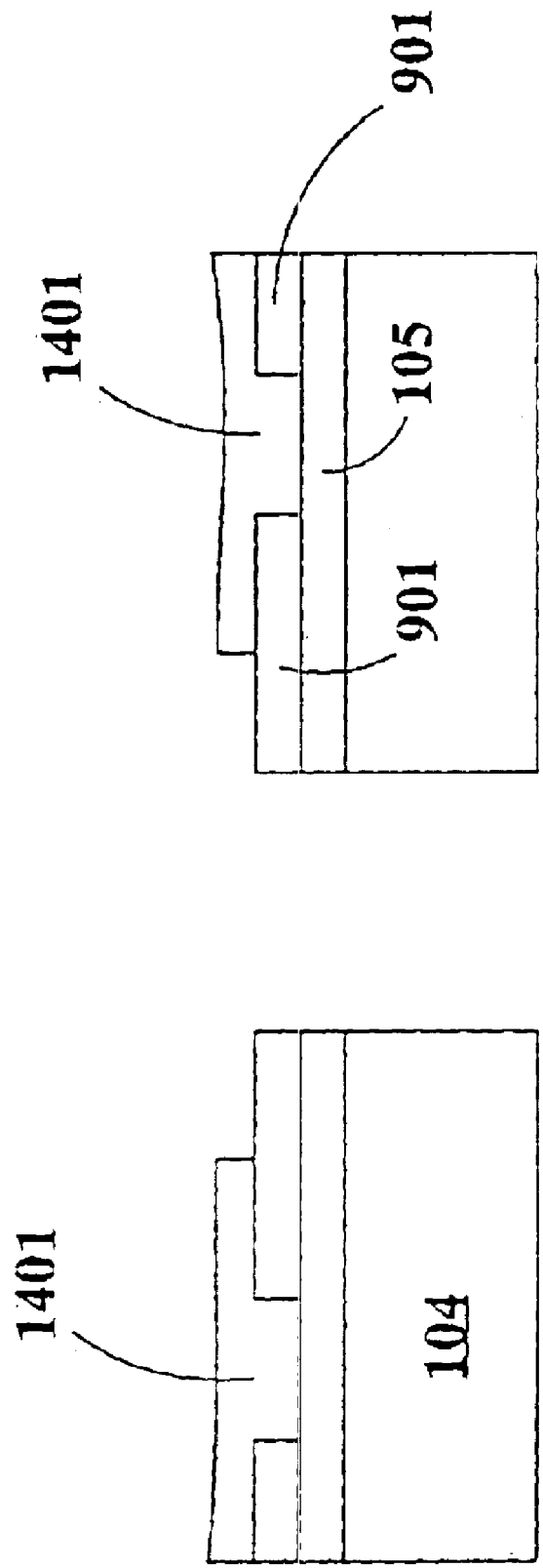
FIG. 26 is a schematic illustration similar to FIG. 25 illustrating the removal of the Indium Tin Oxide and the Al etch mask by selective chemistry that avoids destruction of the ohmic contact trimetal.

FIG. 24 is a schematic illustration 2400 similar to FIG. 23 with the Indium Tin Oxide Cap above the undeveloped photoresist and the undeveloped photoresist removed. FIG. 24 further illustrates selective deep reactive ion etching. Arrow 2401 indicates the direction of the etching of the SiC by the $SF_6$ in the dry reactive ion etching process (DRIE) which may be timed thus controlling the depth of the etching. In the example of FIG. 24, the DRIE continues under the influence of an electric field until the wafer has been completely pierced as illustrated in FIG. 25. FIG. 25 is a schematic illustration 2500 similar to FIG. 24 illustrating a bore 2501 through the SiC wafer portion. In FIG. 25 the wafer still has the Al 1601 and the ITO (or Nickel) 2301 coverings. Hot phosphoric acid is used to remove the protective ITO and Al coverings. FIG. 26 is a schematic illustration 2600 similar to FIG. 25 illustrating the removal of the Indium Tin Oxide and the Al and a completed wafer portion. The description above explains selective chemical removal.

Figure 27:
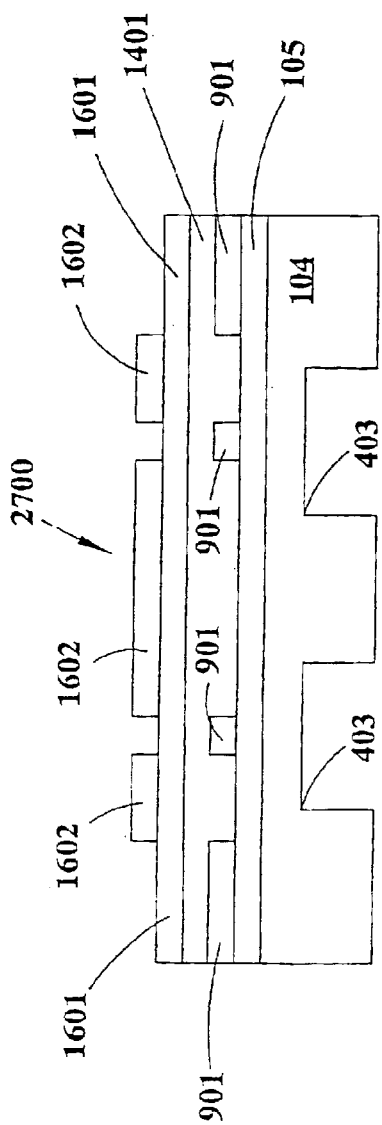
FIG. 27 is a schematic representation of a portion of a wafer similar to that in FIG. 16A with the imidized photoresist stripped away by the developer. The step in FIG. 27 is similar to the step illustrated in FIG. 17 except the structures of the wafers are different.

FIG. 27 is a schematic representation 2700 of a portion of a wafer similar to that in FIG. 16A with the imidized photoresist 1609 (FIG. 16A) stripped away by the developer. The step in FIG. 27 is similar to the step illustrated in FIG. 17 except the structures of the wafers are different and the metallization patterning for engagement with the n-type is different FIG. 16A and FIG. 27 illustrate cavities 403 etched into the backside of the wafer portion.

Figure 28:
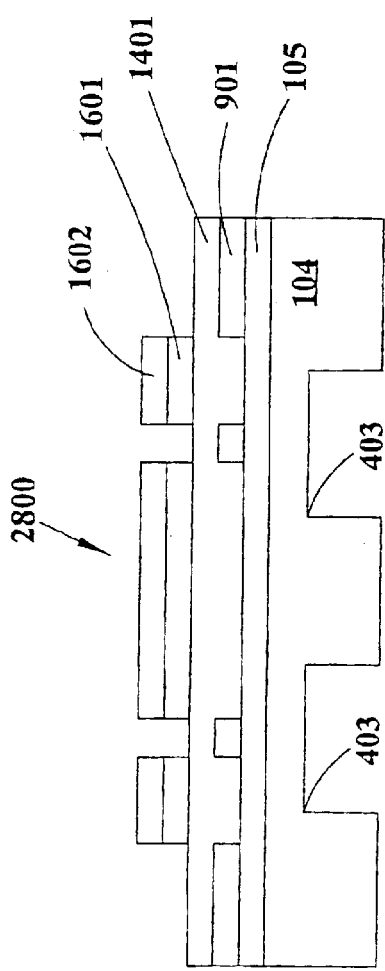
FIG. 28 is a schematic representation of the wafer portion of FIG. 27 with unwanted Al etched away (removed) with aqueous TMAH. The step in FIG. 28 is similar to the step in FIG. 18 except the structures of the wafers are different

FIG. 28 is a schematic representation 2800 of the wafer portion of FIG. 27 with unwanted Al 1601 etched away (removed) with aqueous TMAH in those areas unprotected by unimidized photoresist The step in FIG. 28 is similar to the step in FIG. 18 except the structures of the wafers are different and the metallization patterning for engagement with the n-type SiC epilayer is different.

Figure 29:
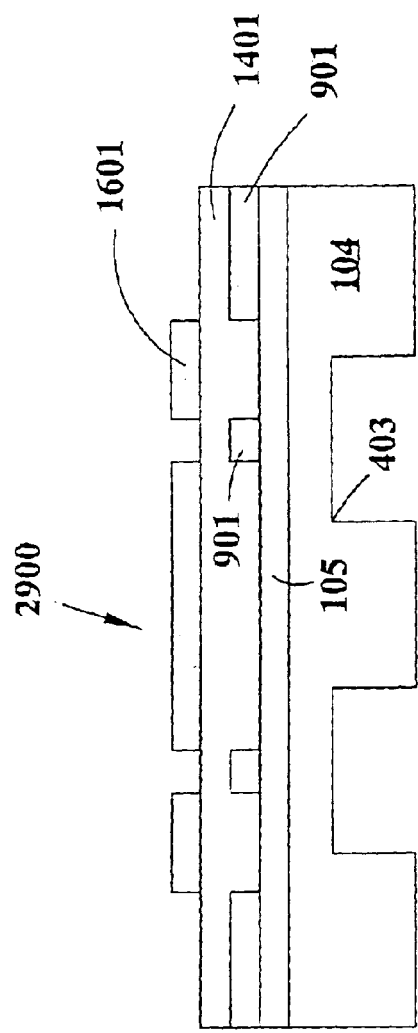
FIG. 29 is a schematic representation of the unimidized photoresist having been removed by Acetone. The step illustrated in FIG. 29 is similar to the step illustrated in FIG. 19 except the structures of the wafers are different.

FIG. 29 is a schematic illustration 2900 of the unimidized photoresist 1602 illustrated in FIG. 28 having been removed by Acetone. The step illustrated in FIG. 29 is similar to the step illustrated in FIG. 19 except the structures of the wafers are different and the metallization patterning for engagement with the n-type SiC epilayer is different.

Figure 30:
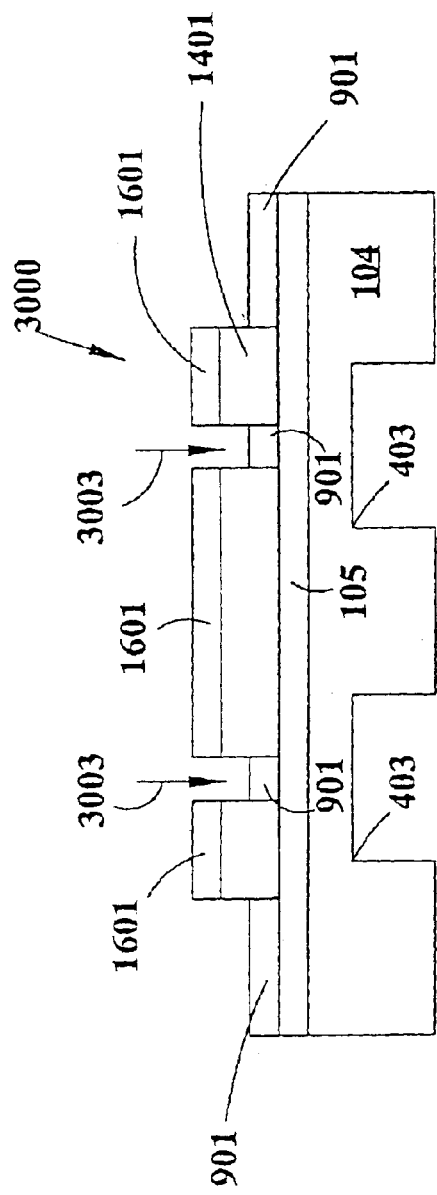
FIG. 30 is a schematic representation of the etching of the trimetal in areas not covered with Al by Argon. The step illustrated in FIG. 30 is similar to the step illustrated in FIG. 20 except that the structures of the wafers are different.

FIG. 30 is a schematic illustration 3000 of Argon plasma etching 3003 of the trimetal 1401 in areas not covered with Al 1601. The step illustrated in FIG. 30 is similar to the step illustrated in FIG. 20 except that the structures of the wafers are different and the metallization patterning for engagement with the n-type SiC epilayer is different. An electric field enables etching with the inert Argon plasma. Other inert gasses may be used.

Figures 31, 32, 33:
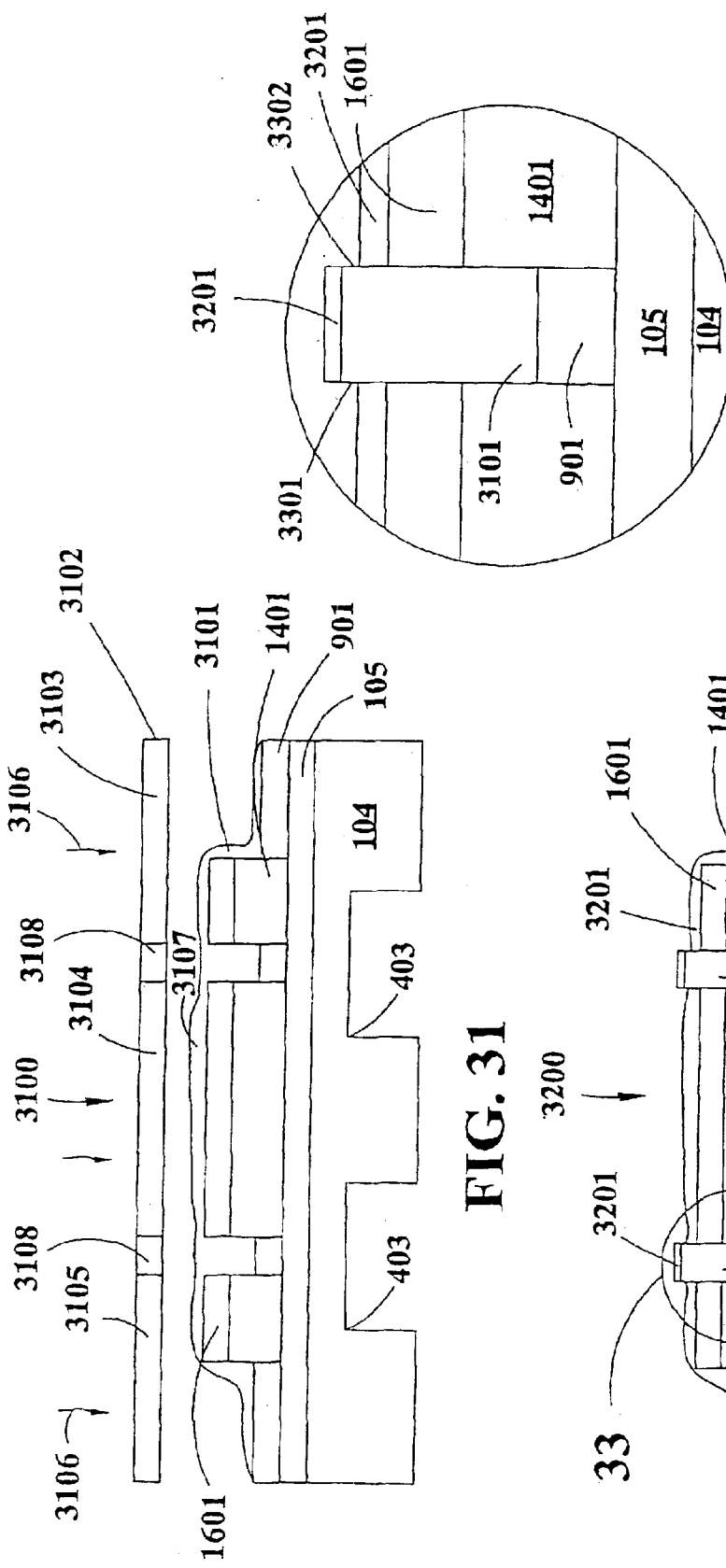
FIG. 31 is a schematic representation of the application of the photoresist to the oxide. Imidized photoresist is stripped away by the developer. The step illustrated in FIG. 31 is similar to the step illustrated in FIG. 21 except the structures of the wafers are different
FIG. 32 is a schematic representation of the application of Indium Tin Oxide to the wafer portion illustrated in FIG. 31.
FIG. 33 is an enlargement of a portion of the wafer as illustrated in FIG. 32 showing the ITO partially covering the unimidized photoresist which resides in a defined cavity.

FIG. 31 is a schematic illustration 3100 of the application of the photoresist 3101 to the oxide 901. Mask 3102 includes opaque portions 3108 and transparent portions 3103, 3104 and 3105. Ultraviolet light 3106 imidizes those portions of photoresist under the transparent portions 3103, 3104 and 3105 of the mask. Imidized photoresist is stripped away by the developer. Again, FIG. 31 is an illustration and is not to scale. The surface defined by the the oxide 901 and Al 1601 on top of the contact metallization 1401 is substantially planar because the oxide 901 is 50–100 nm thick, the trimetal 1401 is 300 to 600 nm thick, and the Al 1601 is only 1–2 microns thick. The photoresist is spun onto the wafer 800 such that it has a thickness of approximately 6 microns thick. Since photoresist is applied 6 microns thick, the height above the n-type SiC epilayer varies between a minimum of 50 nm which is the minimum thickness of the oxide 901 to a maximum of 600 nm (maximum thickness of the trimetal) plus the thickness of Al 1601 at its maximum of 2 microns. Therefore, the profile of the surface of the materials atop the wafer illustrated in FIG. 31 varies from a minimum of 50 nm (minimum oxide thickness) to a maximum of 2,600 nm (600 nm (maximum trimetal 1401 thickness) plus 2,000 nm (maximum thickness of Al 1601)). Since 6 microns is equal to 6,000 nm coverage of the wafer is good and yield of the SiC wafer is very high The step illustrated in FIG. 31 is similar to the step illustrated in FIG. 21 except the structures of the wafers are different and the contact metallization patterning for engagement with the n-type SiC epilayer is different.

Figure 34:
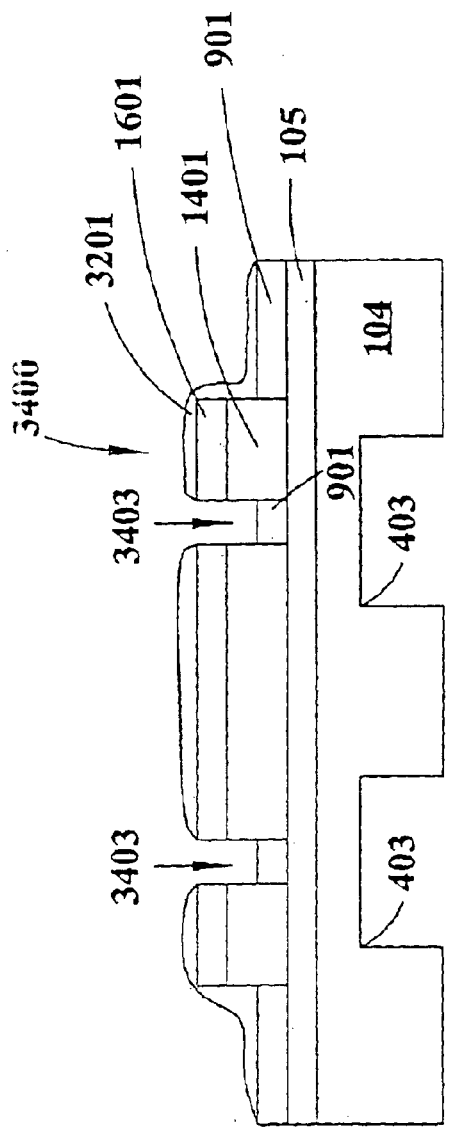
FIG. 34 is a schematic representation of the dry reactive ion etching similar to FIG. 24 except the structures of the wafers are different.

FIG. 32 is a schematic illustration of the application of a layer Indium Tin Oxide 3201 or Nickel at a thickness of 1–2 microns to the wafer portion illustrated in FIG. 31 after the imidized photoresist has been stripped away. The results of the application of ITO in FIG. 32 are very similar to the application of ITO or Nickel as in FIG. 23 previously described above. The ITO 3201, due to its relatively thin thickness, as compared to that of the unimidized photoresist 3101 underlying a portion of the ITO, does not completely cover the unimidized photoresist 3301 as is best viewed in FIG. 33. FIG. 33 is an enlargement of a portion of the wafer as illustrated in FIG. 32 showing the ITO 3201 partially covering the unimidized photoresist 3101. Reference numerals 3301 and 3302 indicate exposed areas of unimidized photoresist which are subsequently attacked and dissolved by Acetone leaving the structure illustrated in FIG. 34. Deep reactive ion etching using an inert gas plasma is indicated by flow arrow 3403 in FIG. 34. FIG. 34 is a schematic illustration 3400 of the dry reactive ion etching 3403 similar to FIG. 24 except the structures of the wafers are different and the contact metallization pattern is different FIG. 34 illustrates the oxide 901 exposed to the deep reactive ion etching with a gas, for example, Ar or under the influence of an electric field.

Figure 35:
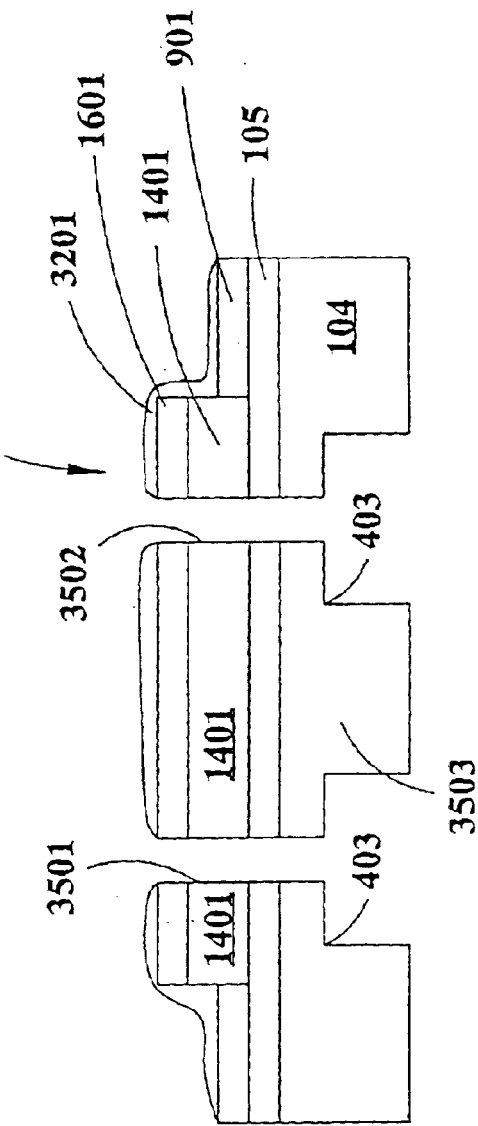
FIG. 35 is a schematic illustration similar to FIG. 34 with two bores through the wafer illustrated.
Figure 36:
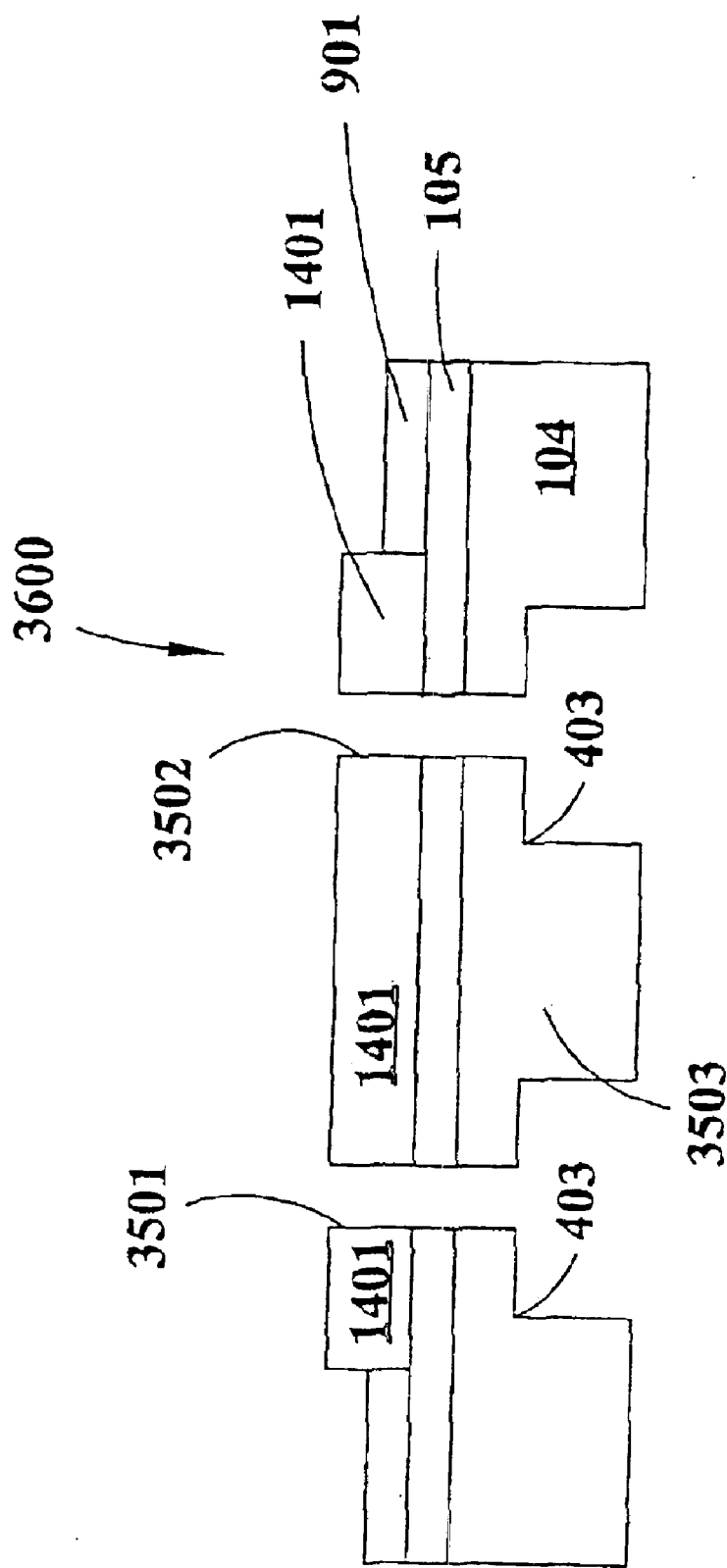
FIG. 36 is a schematic of a completed accelerometer with the ITO and Al having been selectively stripped in a bath of hot phosphoric acid without attacking the ohmic contact.

FIG. 35 is a schematic illustration 3500 similar to FIG. 34 with two bores 3501 and 3502 through the wafer portion illustrated. Indium Tin Oxide 3201 and Al 1601 are illustrated in FIG. 35 and they are removed by immersing the wafer portion in hot phosphoric acid. FIG. 36 is a schematic illustration 3600 of a completed accelerometer with the ITO and Al having been removed in a bath of hot phosphoric acid. A bridge not shown in this view suspends the proof mass 3503 illustrated in FIGS. 35 and 36.

Figure 37:
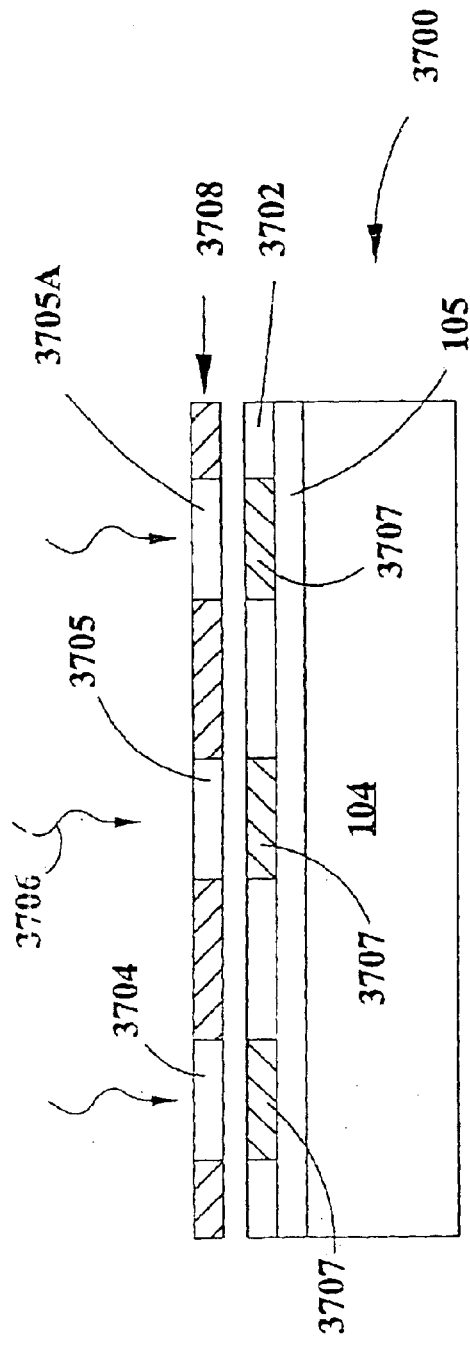

FIGS. 37–42 illustrate schematically the preparation of the n-type epilayer for metallization. FIG. 37 is a view 3700 which illustrates the application of photoresist 3702, a desired mask 3708 with transparent portions 3704, 3705, and 3705A and ultraviolet light 3706 to a portion of a wafer 3700. Imidized portions 3707 of photoresist 3702 are stripped away by developer.

Figure 38:
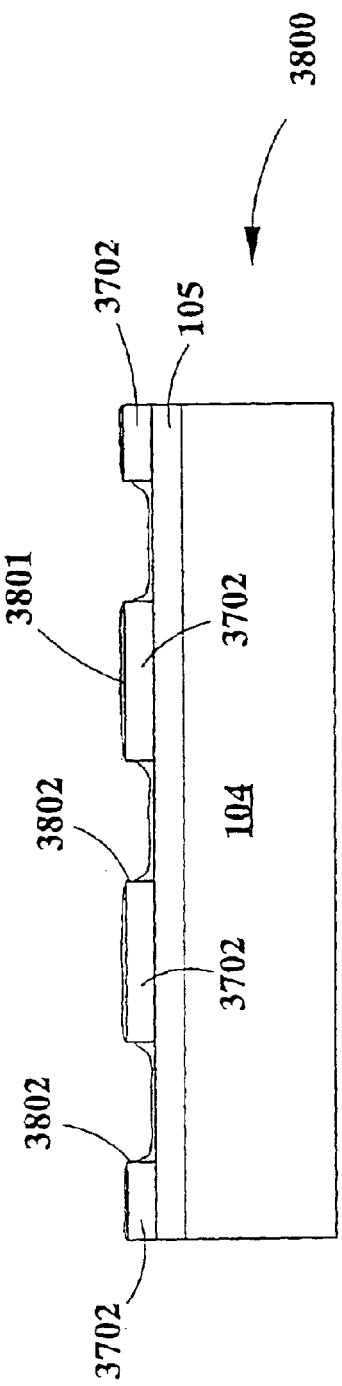
Figure 38A:
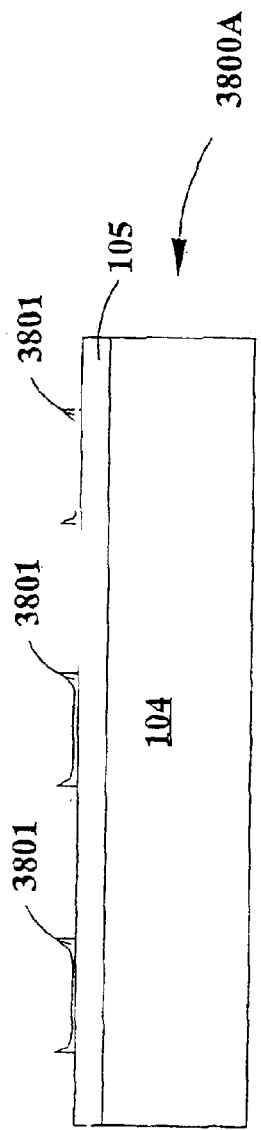
FIG. 38A illustrates the portion of the wafer as illustrated in FIG. 38 with Acetone having dissolved unimidized photoresist and lifted off the ITO in certain places.
Figure 39:
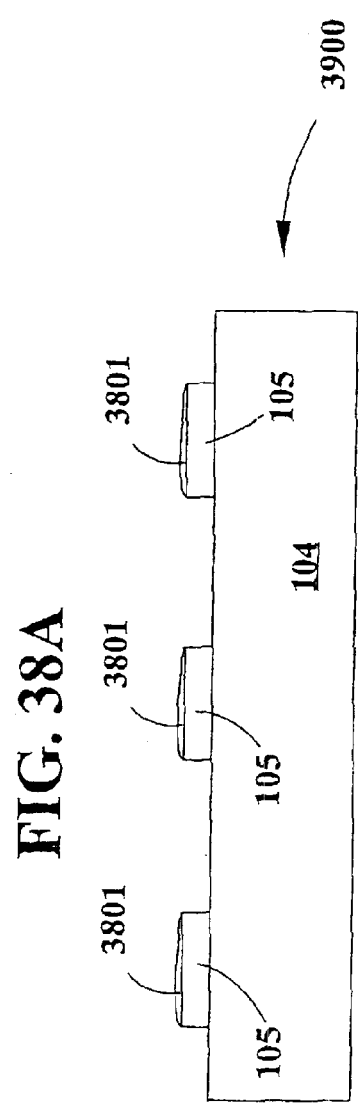
Figure 40:
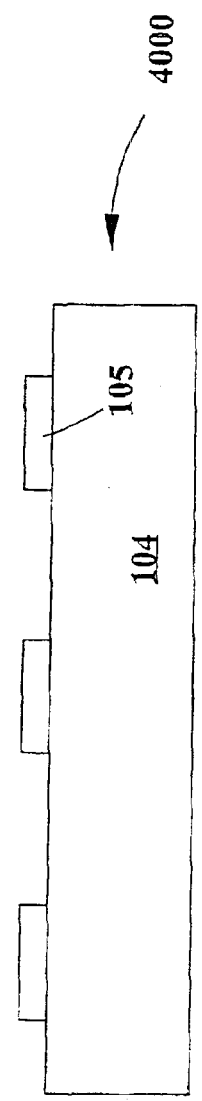

FIG. 38 is a view 3800 which illustrates the application of Indium Tin Oxide or Nickel 3801 to the portion of the wafer as illustrated in FIG. 37. Reference numerals 3802 indicate areas not covered by the ITO. FIG. 38A is a view 3800A which illustrates the portion of the wafer as illustrated in FIG. 38 with Acetone having dissolved unimidized photoresist 3702 resulting in the lift off of ITO 3801 in certain desired places leaving n-type epilayer 105 covered with ITO 3801. Plasma etching of the n-type epilayer forms piezoresistors as shown in FIG. 39. FIG. 40 is a view is 4000 which illustrates the removal of the ITO/Nickel illustrated in FIG. 39 which remained on the n-type piezoresistors.

FIG. 41 is a view 4100 which is identical to FIG. 40 except a recess 403 has been manufactured in the back side of the substrate. FIG. 41A is a view 4100A similar to FIG. 41 except a different recess 4103A has been manufactured in the back side of the substrate 4100A and a different pattern of piezoresistors has been formed out of the n-type epilayer.

Figure 42:
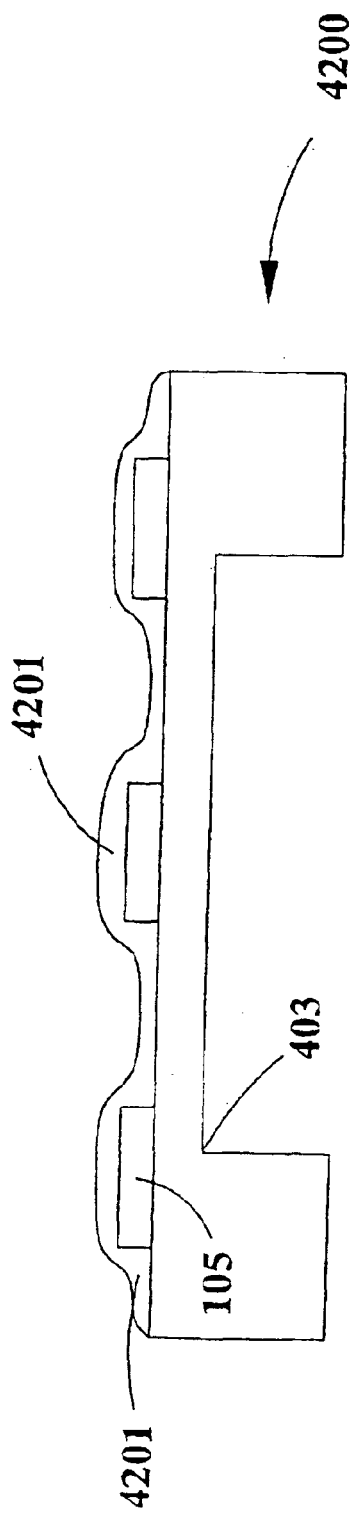
Figure 42A:
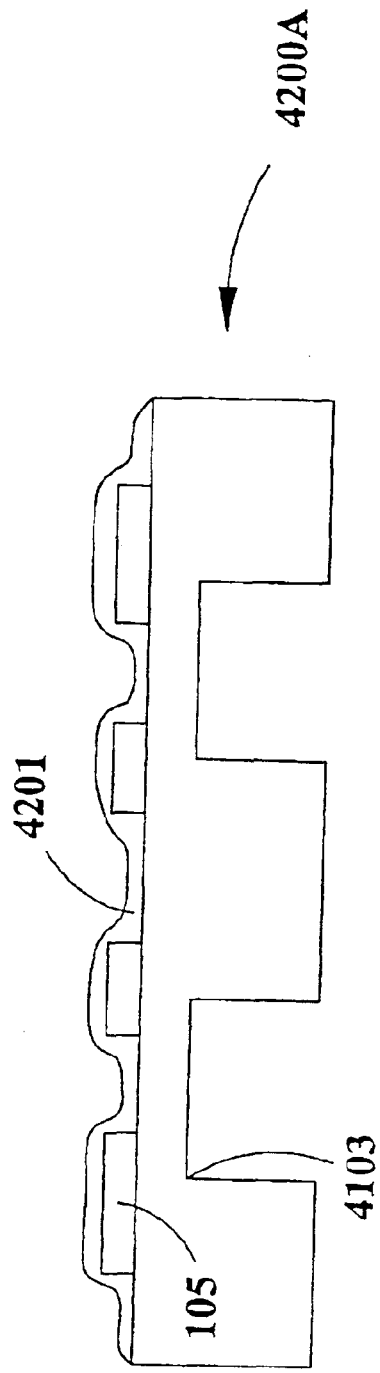

FIGS. 42 and 42A illustrate views 4200, 4200A which are similar to FIGS. 41 and 41A respectively except an additional layer of oxide 4201 has been grown or deposited over the n-type piezoresistors 105 and the substrate.

Figure 43:
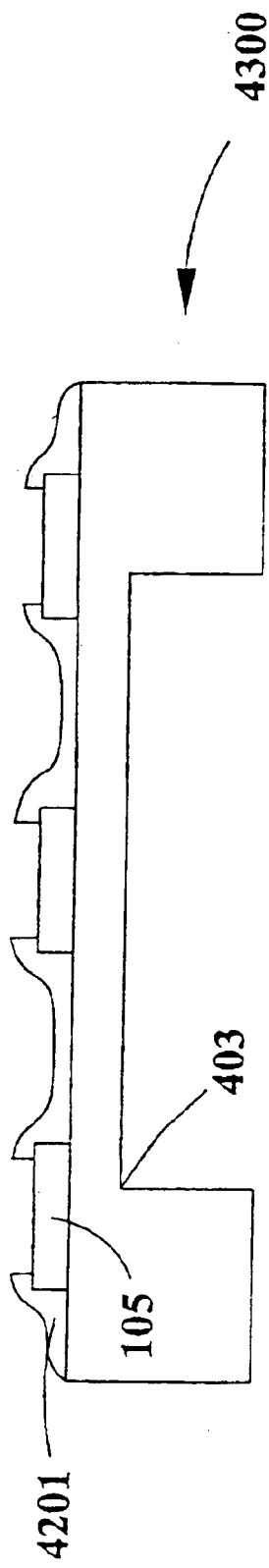
FIGS. 43 and 43A are similar to FIGS. 42 and 42A respectively with sections of the piezoresistors exposed by applying photoresist, baking the photoresist, applying the desired mask, exposing the desired portion of the photoresist to ultraviolet light to imidize the photoresist, develop and then wet etching the oxide in buffered hydrofluoric acid to expose sections of the piezoresistors. Acetone is used to remove the unimidized photoresist.

FIGS. 43 et seq. represent a side by side comparison of a pressure sensor (FIGS. 43–48) with an accelerometer (FIGS. 43A–48A). Various aspects of the steps shown in these drawing figures has been shown in FIG. 13 to FIG. 36 above. Reference should be made to FIGS. 13 to 36 and to the description of those drawing figures to better aid in an understanding of FIG. 43 et seq. Those skilled in the art will readily recognize that many different configurations of piezoresistors may be employed on a multitude of different substrates without departing from the spirit and scope of the appended claims.

Figure 43A:
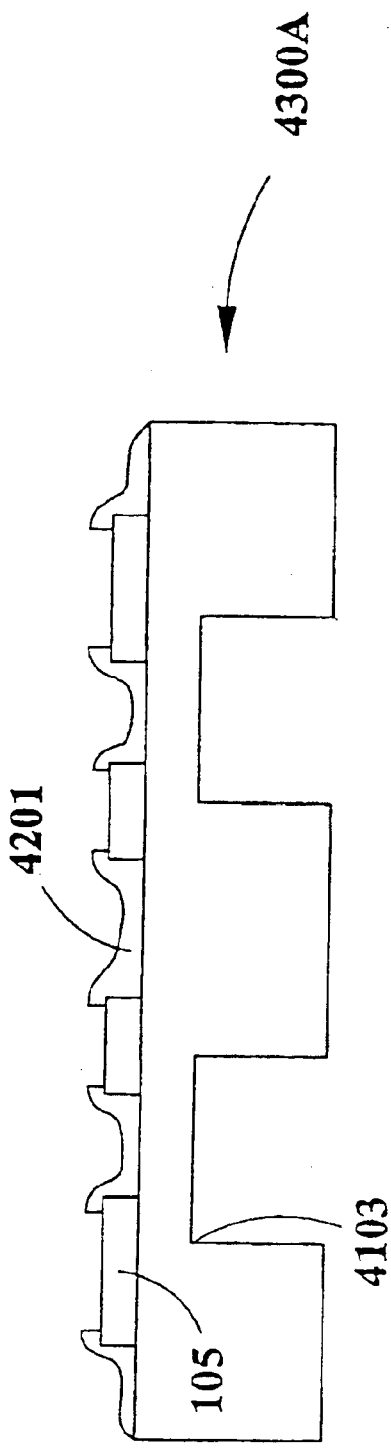

FIGS. 43 and 43A illustrate views 4300, 4300A which are similar to FIGS. 42 and 42A, respectively, with the piezoresistors exposed by applying photoresist, baking the photoresist, applying the desired mask, exposing the desired portion of the photoresist to ultraviolet light to imidize the photoresist and then wet etching the oxide 4201 in buffered hydrofluoric acid to expose portions of the piezoresistors where metal contacts will be deposited. Acetone is used to remove the unimidized photoresist. FIGS. 43 and 43A illustrate the piezoresistors exposed for metallization.

Figure 44:
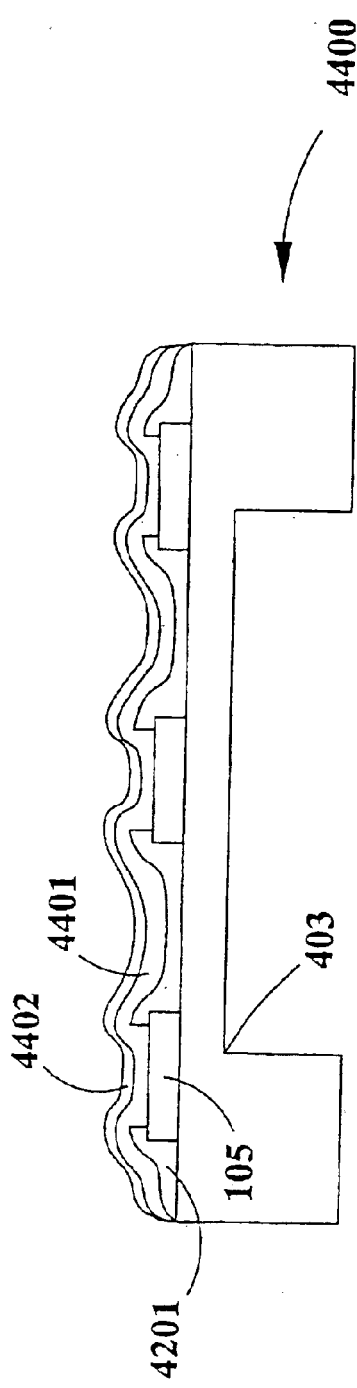
FIGS. 44 and 44A illustrate application of the trimetal to the piezoresistors and the application of Aluminum to the trimetal.
Figure 44A:
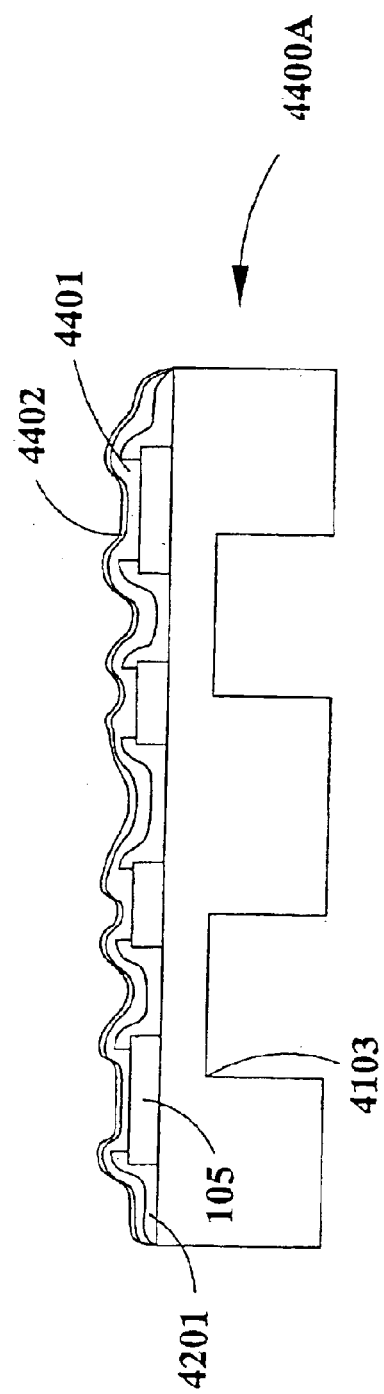

FIGS. 44 and 44A illustrate views 4400, 4400A which schematically indicate application of the trimetal 4401 to the piezoresistors 105 and the application of Aluminum 4402 to the trimetal 4401.

Figure 45:
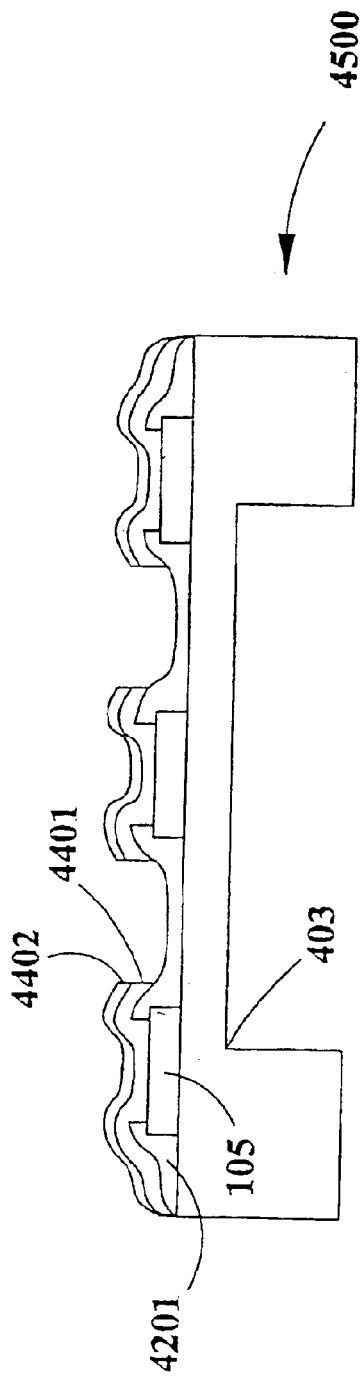
FIGS. 45 and 45A are similar to FIGS. 44 and 44A except the portions of the Aluminum and trimetal have been removed. Photoresist was applied, baked, masked and exposed to ultraviolet light as illustrated in FIG. 16. Imidized photoresist was developed and stripped away as illustrated in FIG. 17, the Aluminum was etched away with TMAH as illustrated in FIG. 18. Next, the photoresist was striped away as illustrated in FIG. 19 and then the trimetal was plasma etched as illustrated in FIG. 20.
Figure 45A:
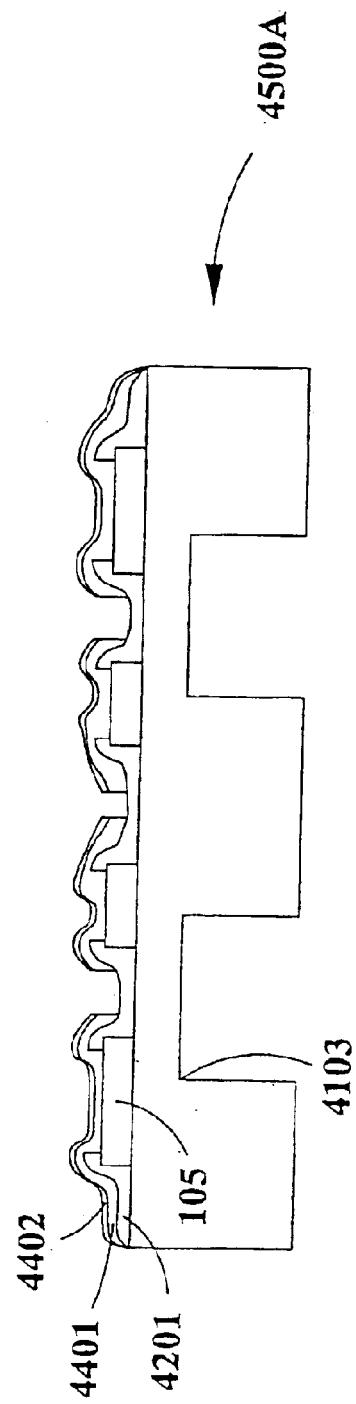

FIGS. 45 and 45A are views 4500, 4500A which are similar to FIGS. 44 and 44A except portions of the Aluminum 4402 and trimetal 4401 have been removed. Photoresist was applied, baked, masked and exposed to ultraviolet light as illustrated in FIG. 16. Imidized photoresist was developed and stripped away as illustrated in FIG. 17, and the Aluminum was etched away with TMAH as illustrated in FIG. 18. Next, the photoresist was stripped away as illustrated in FIG. 19 and then the trimetal 4401 was plasma etched as illustrated in FIG. 20. FIGS. 45 and 45A illustrate oxide exposed.

FIG. 46 is a view 4600 similar to FIG. 45 except ITO 4601 has been applied to the wafer portion. The wafer portion of FIG. 46 undergoes the same process as the wafer portion of FIG. 46A.

FIG. 46A is a view 4600A similar to FIG. 45A except photoresist is applied to the wafer, soft baked, masked and exposed to ultraviolet light as illustrated in FIGS. 21 and 22. Imidized photoresist is stripped away and ITO 4601 is applied to the wafer. Acetone dissolves the unimidized photoresist and carries away with it ITO caps residing above the unimidized photoresist as best illustrated in FIGS. 23 and 33. Reference numeral 4602 as indicated in FIG. 46A indicates exposed oxide which is ready for deep reactive ion etching. Those exposed sections are exposed because the photoresist and ITO has been stripped away.

Figure 47:
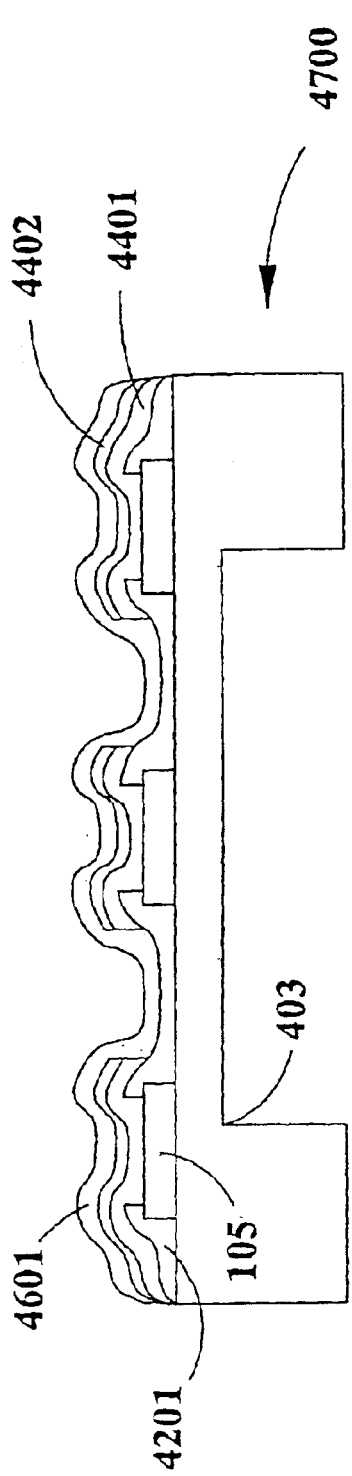
FIGS. 47 and 47A illustrate deep reactive ion etching in the portions of the wafer with exposed oxide forming through holes in FIG. 47A.
Figure 47A:
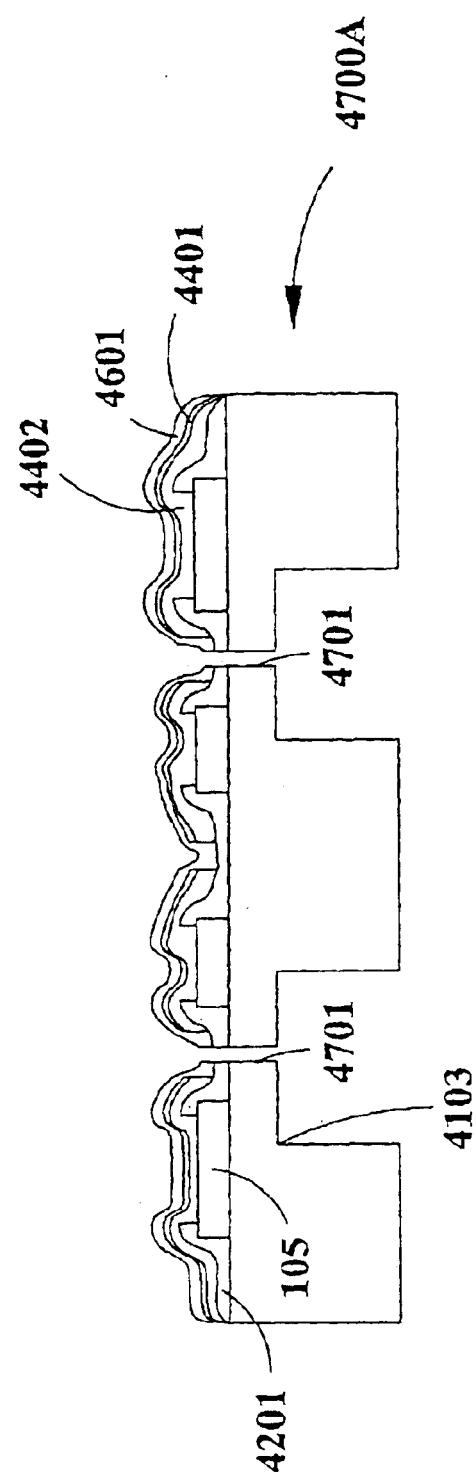
Figure 48:
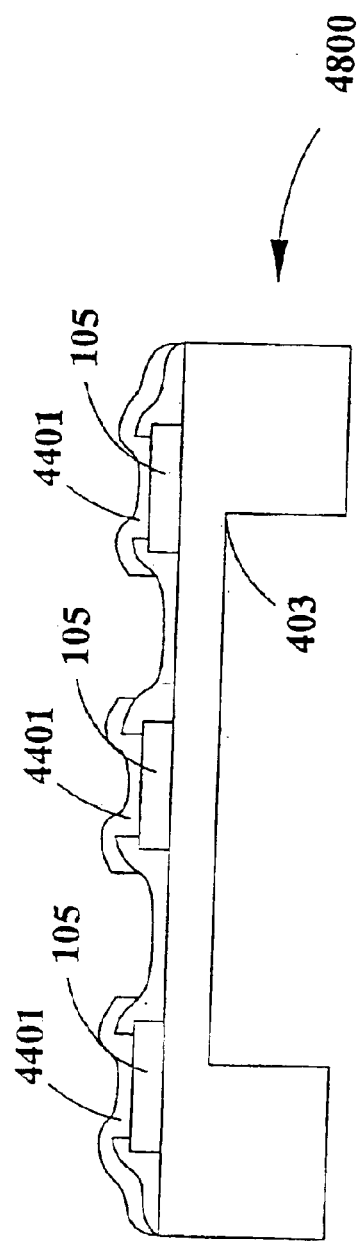
FIGS. 48 and 48A illustrate the removal of the Aluminum and the ITO by selective etching to recover the clean surface of the trimetal which preferably is the Platinum layer of the trimetal.
Figure 48A:
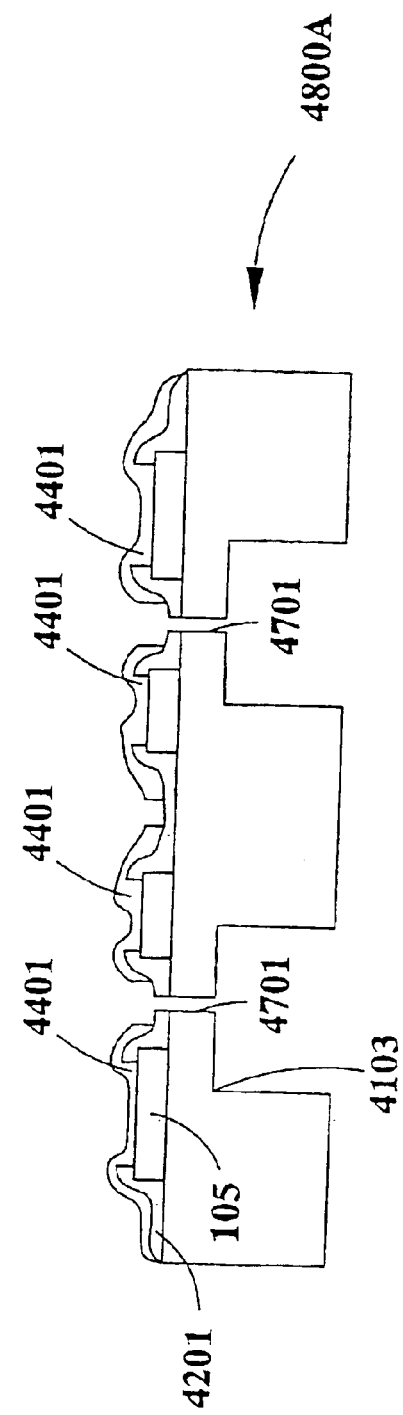

FIGS. 47 and 47A illustrate views 4700, 4700A, respectively, of deep reactive ion etching 1S in the portions of the wafer with exposed oxide 4201 forming through holes 4701 in FIG. 47A. No through hole is formed in FIG. 47 which remains as a diaphragm for a pressure sensing. A through hole is formed in FIG. 47A which makes it an accelerometer. FIGS. 48 and 48A illustrate views 4800, 4800A of the removal of the Aluminum and the ITO to recover the clean surface of the trimetal 4401 which preferably is the Platinum layer of the trimetal.

The invention has been described herein by way of example only. Those skilled in the art will readily recognize that structural changes, method changes and material changes may be made to those disclosed herein without departing from the spirit and scope of the appended

I claim:

1. A SiC accelerometer comprising a proof mass and an ohmic contact, and said ohmic contact comprises layers of Titanium, Tantalum Disilicide, and Platinum.

2. A SiC accelerometer as claimed in claim 1 further comprising a substrate and a bridge, and wherein said bridge interconnects said proof mass and said substrate.

3. A SiC accelerometer as claimed in claim 2 wherein said bridge includes an n-type SiC epilayer.

4. An accelerometer comprising a proof mass and an ohmic contact, said ohmic contact comprises layers of Titanium, Tantalum Disilicide, and Platinum, a bridge and a substrate, said bridge interconnects said proof mass and said substrate, said bridge includes an epilayer, and, said substrate is selected from the group of SiC, AlN, BC, and $Al_2O_3$.

5. An accelerometer as claimed in claim 4 wherein said substrate is n-type.

6. An accelerometer as claimed in claim 4 wherein said substrate is p-type.

* * * * *